(12) United States Patent
Luo et al.

(10) Patent No.: US 7,468,998 B2
(45) Date of Patent: Dec. 23, 2008

(54) RADIO FREQUENCY MODULATION OF VARIABLE DEGREE AND AUTOMATIC POWER CONTROL USING EXTERNAL PHOTODIODE SENSOR FOR LOW-NOISE LASERS OF VARIOUS WAVELENGTHS

(75) Inventors: Ningyi Luo, Fremont, CA (US); Sheng-Bai Zhu, Fremont, CA (US); Joshua Ji, Santa Clara, CA (US)

(73) Assignee: Pavilion Integration Corporation, San Jose, CA (US)

( * ) Notice: Subject to any disclaimer, the term of this patent is extended or adjusted under 35 U.S.C. 154(b) by 329 days.

(21) Appl. No.: 11/386,950

(22) Filed: Mar. 22, 2006

(65) Prior Publication Data

US 2006/0215716 A1  Sep. 28, 2006

Related U.S. Application Data

(60) Provisional application No. 60/665,175, filed on Mar. 25, 2005.

(51) Int. Cl.
*H01S 3/00* (2006.01)
(52) U.S. Cl. .................. 372/38.02; 372/38.07
(58) Field of Classification Search .............. 372/38.08, 372/29.01, 38.07, 29, 29.015, 38.03, 38.01; 359/285
See application file for complete search history.

(56) References Cited

U.S. PATENT DOCUMENTS

| | | | |
|---|---|---|---|
| 4,972,425 A | | 11/1990 | Braski |
| 5,027,362 A | * | 6/1991 | Hokanson et al. ........ 372/38.01 |
| 5,065,401 A | | 11/1991 | Scifres et al. |
| 5,077,748 A | | 12/1991 | Kozlovsky et al. |
| 5,175,722 A | | 12/1992 | Minami et al. |
| 5,197,059 A | | 3/1993 | Minami et al. |
| 5,386,409 A | | 1/1995 | Yokota et al. |
| 5,422,900 A | | 6/1995 | Reele et al. |
| 5,495,464 A | | 2/1996 | Fujikawa |
| 5,809,049 A | | 9/1998 | Schaefer et al. |
| 5,970,078 A | | 10/1999 | Walker |
| 5,974,063 A | * | 10/1999 | Yoshida ................... 372/38.02 |

(Continued)

FOREIGN PATENT DOCUMENTS

WO    WO 02/95990    5/2002

*Primary Examiner*—Minsun Harvey
*Assistant Examiner*—Tuan N. Nguyen

(57) ABSTRACT

A low-noise laser diode module comprises a laser diode for emitting light with a wavelength in the range from UV to IR, a drive circuit for injecting electrical current into said diode, and an automatic power control circuit for monitoring and adjusting laser output power using front-facet photodiode external to the laser assembly and a feedback loop. Said drive circuit produces injection current modulated by an RF signal with variable degrees, depending on the wavelength to be stabilized, the desired spectral bandwidths of the laser output, and/or other applications. Said RF signal can be a sine wave, a distorted sine wave, a rectified sine wave, a non-sine wave, a series of narrow pulses, or repetitive shunt. The present invention encompasses a method for producing stable, broadband, and low-coherent laser. The present invention also encompasses a method for producing stable narrowband or single longitudinal mode laser. The present invention further encompasses a compact light source applicable to DPSS lasers, fiber lasers, optical parametric oscillators, low-speckle laser display systems, and seeders, with or without nonlinear frequency conversion processes.

10 Claims, 25 Drawing Sheets

U.S. PATENT DOCUMENTS

| | | |
|---|---|---|
| 6,049,073 A | 4/2000 | Roddy et al. |
| 6,215,809 B1 | 4/2001 | Ziari et al. |
| 6,226,309 B1 | 5/2001 | Tsubota |
| 6,240,119 B1 | 5/2001 | Ventrudo |
| 6,347,107 B1 | 2/2002 | Roddy et al. |
| 6,385,219 B1 * | 5/2002 | Sonoda ........................ 372/28 |
| 6,483,956 B1 | 11/2002 | Shevy |
| 6,553,043 B1 | 4/2003 | Bortz et al. |
| 6,590,912 B2 | 7/2003 | Takata |
| 6,600,590 B2 | 7/2003 | Roddy et al. |
| 6,625,381 B2 | 9/2003 | Roddy et al. |
| 6,657,729 B2 * | 12/2003 | Lo et al. ..................... 356/460 |
| 6,678,306 B1 | 1/2004 | Sonoda |
| 6,711,188 B2 | 3/2004 | Ito et al. |
| 6,826,215 B2 | 11/2004 | Tsuji et al. |
| 6,855,919 B2 | 2/2005 | Taguchi |
| 6,882,666 B2 | 4/2005 | Kazarinov et al. |
| 6,914,872 B2 | 7/2005 | Tanaka |
| 6,922,423 B2 | 7/2005 | Thornton |
| 6,999,838 B2 | 2/2006 | Roddy et al. |

* cited by examiner

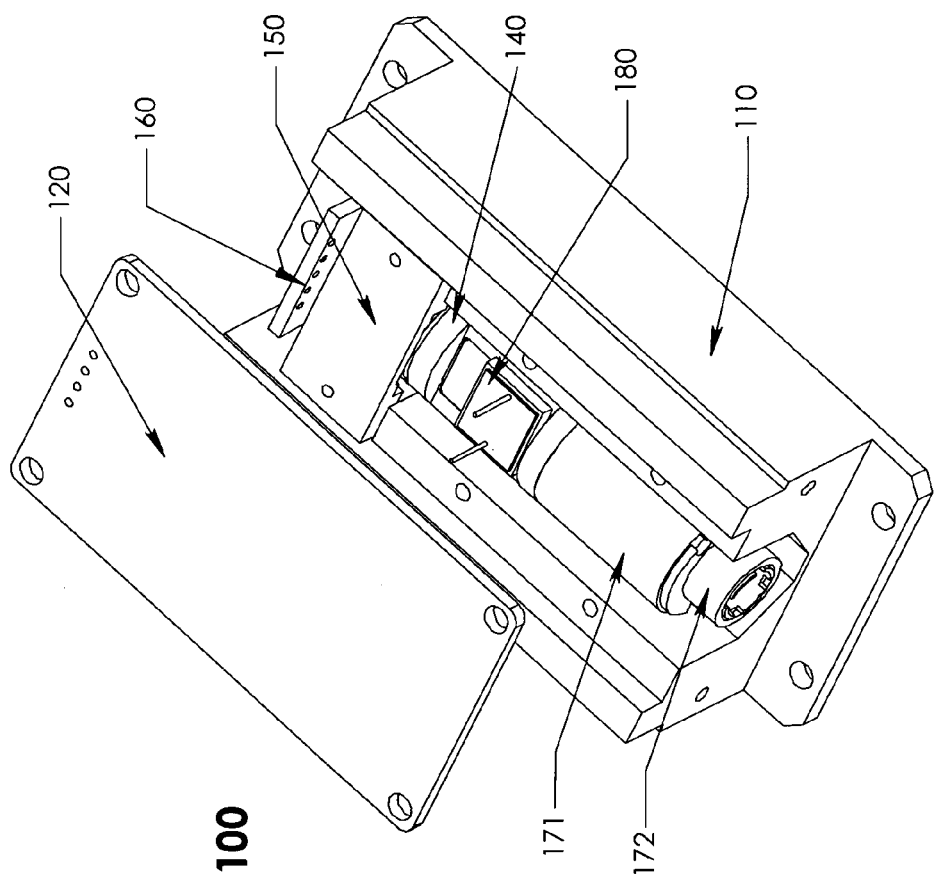

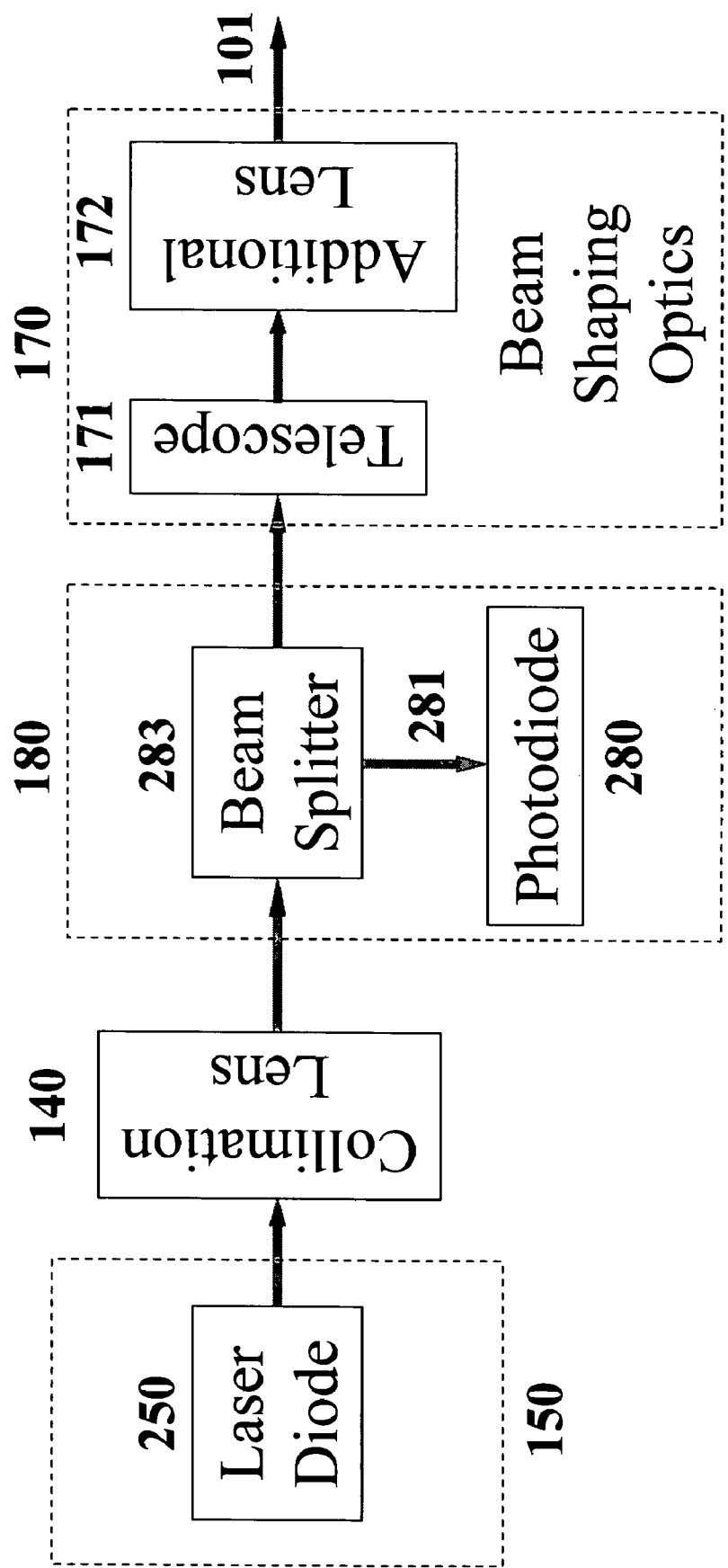

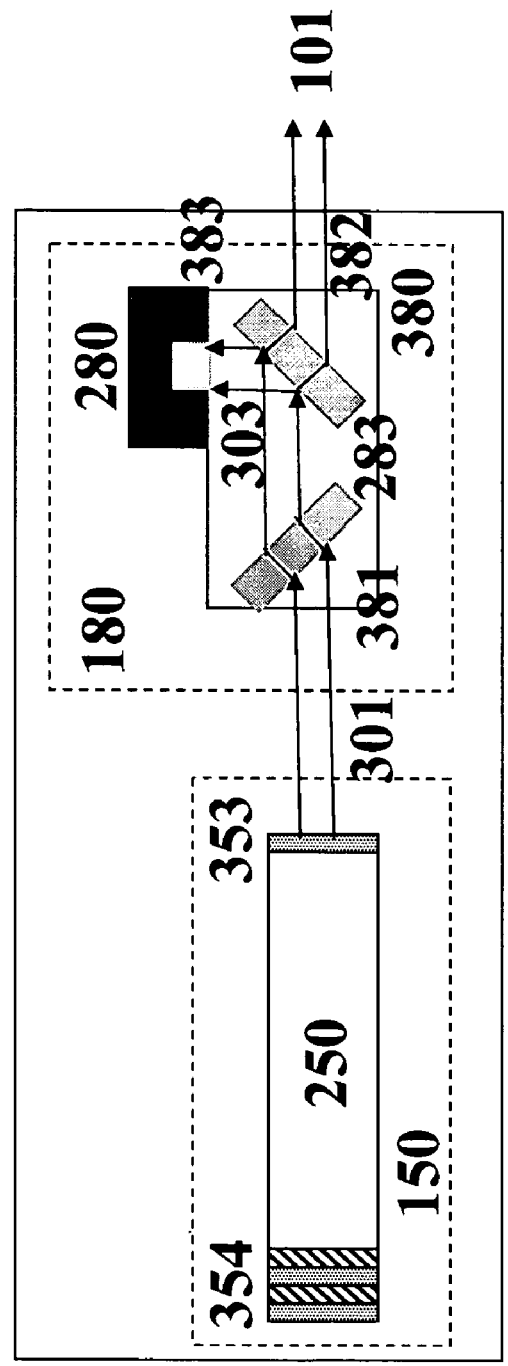

FIG 5A
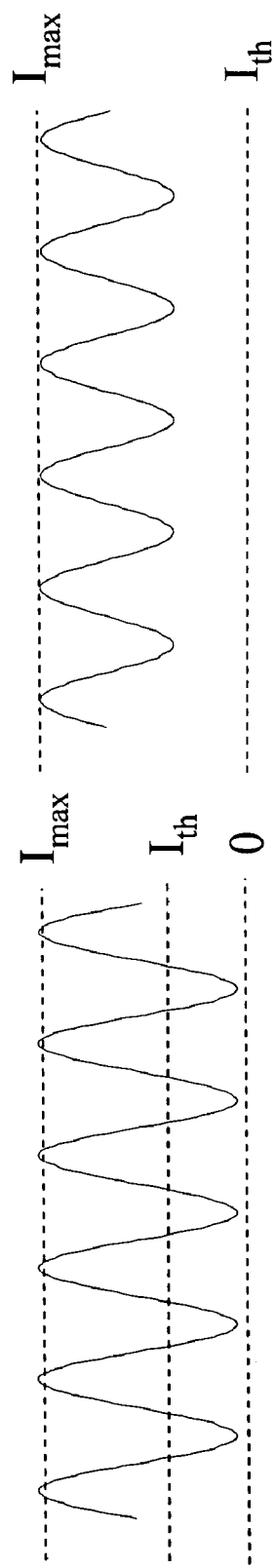
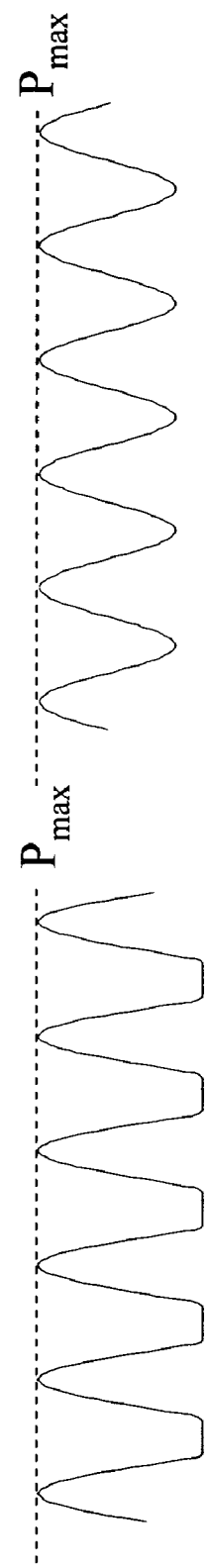
Drive Current
Laser Output

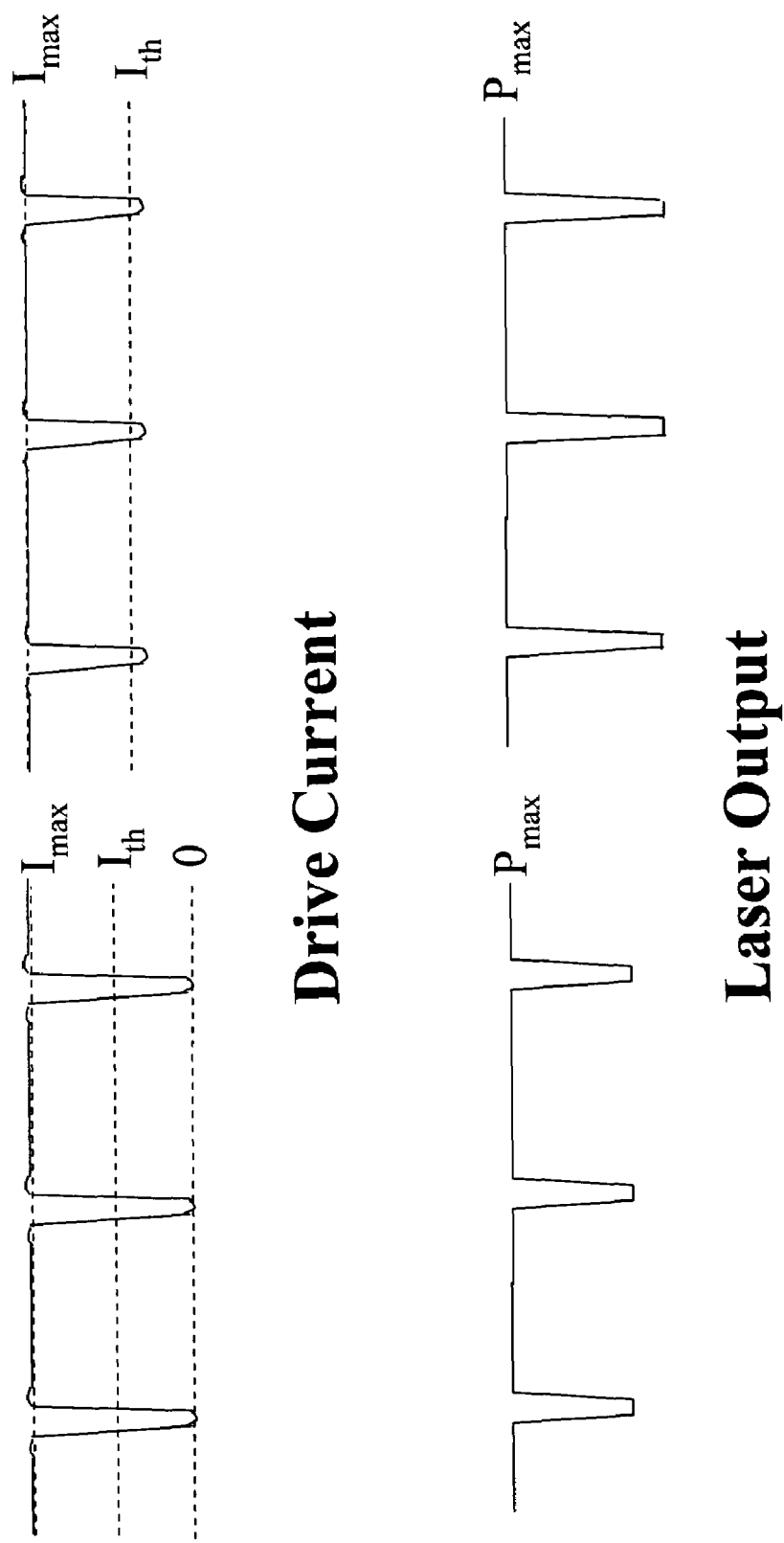

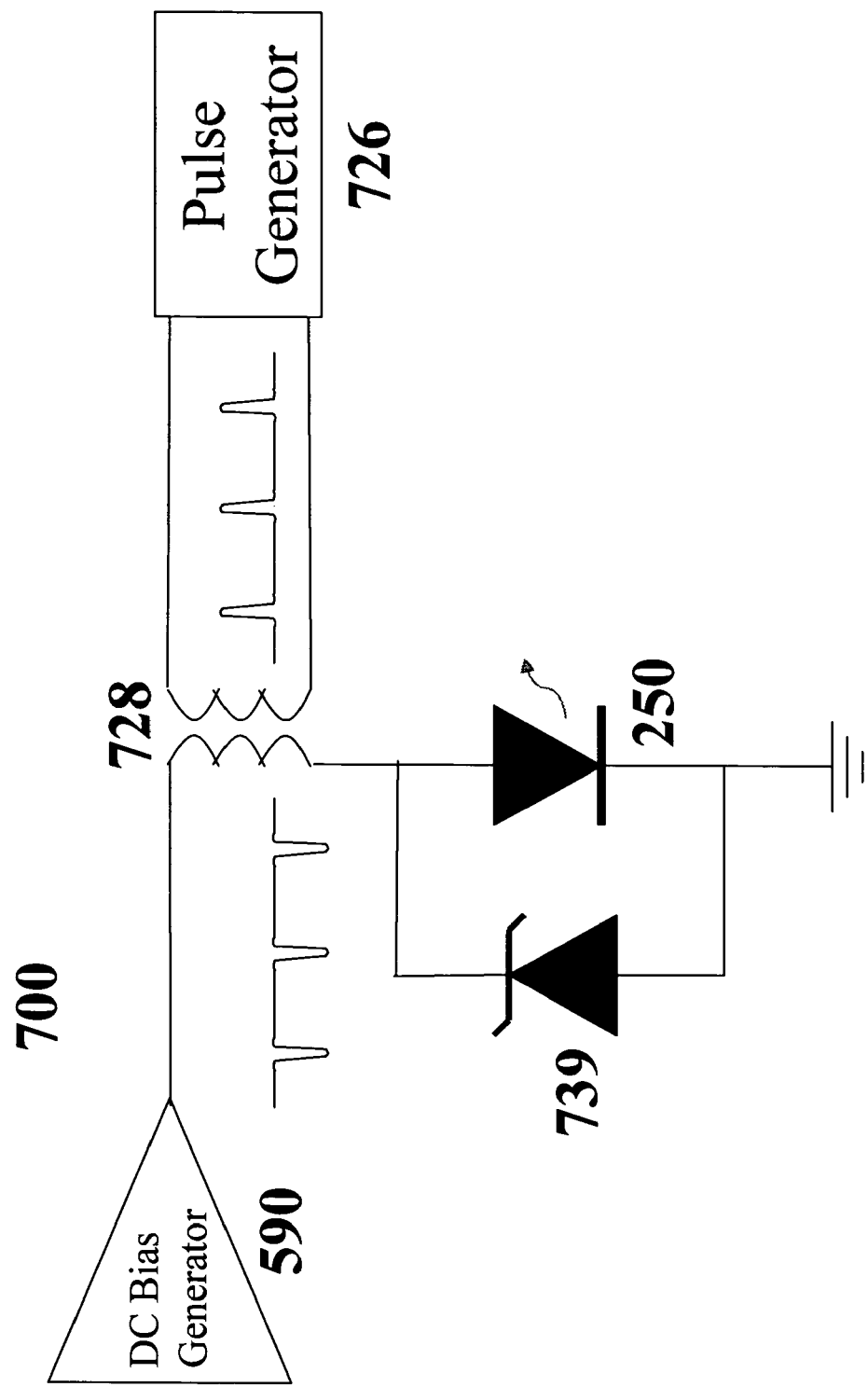

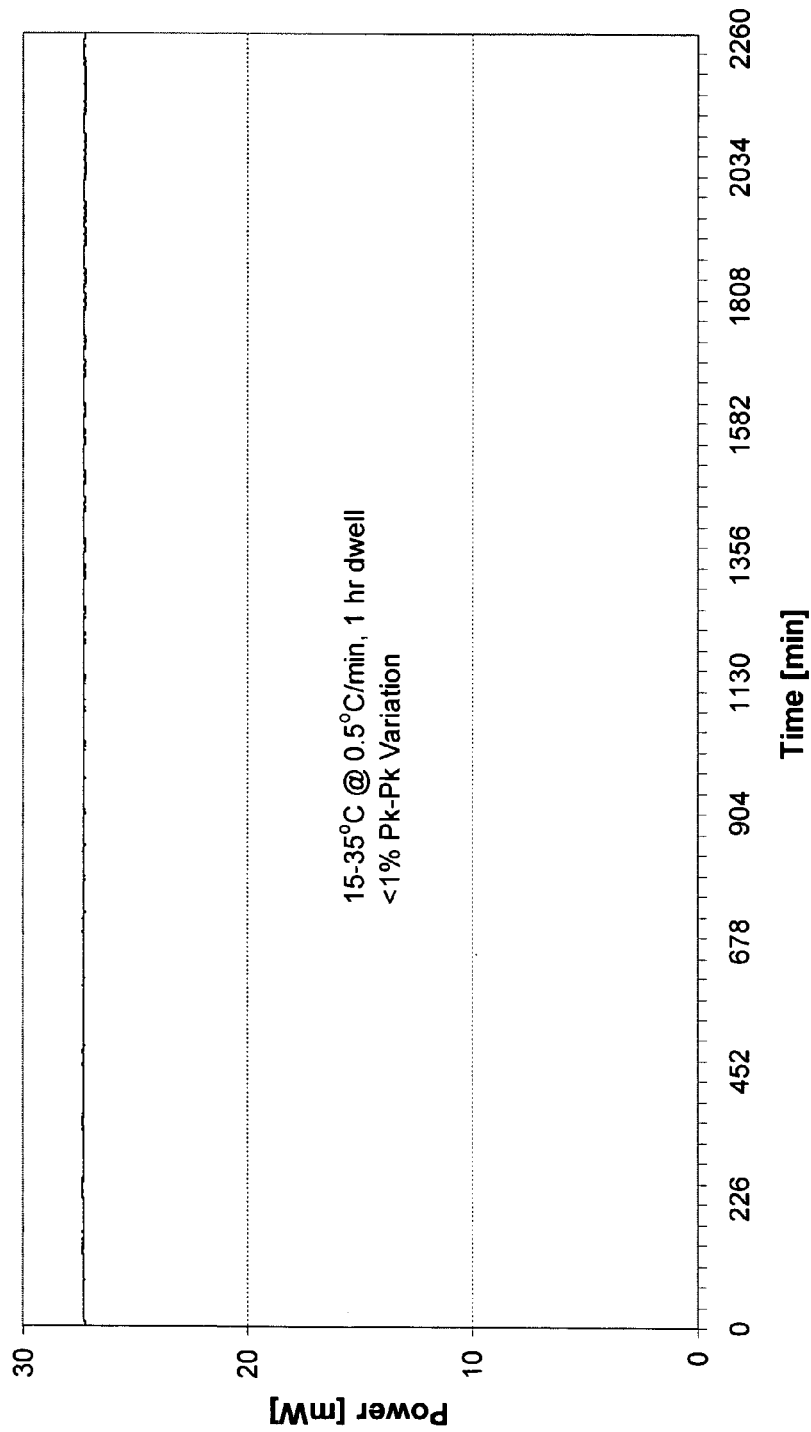

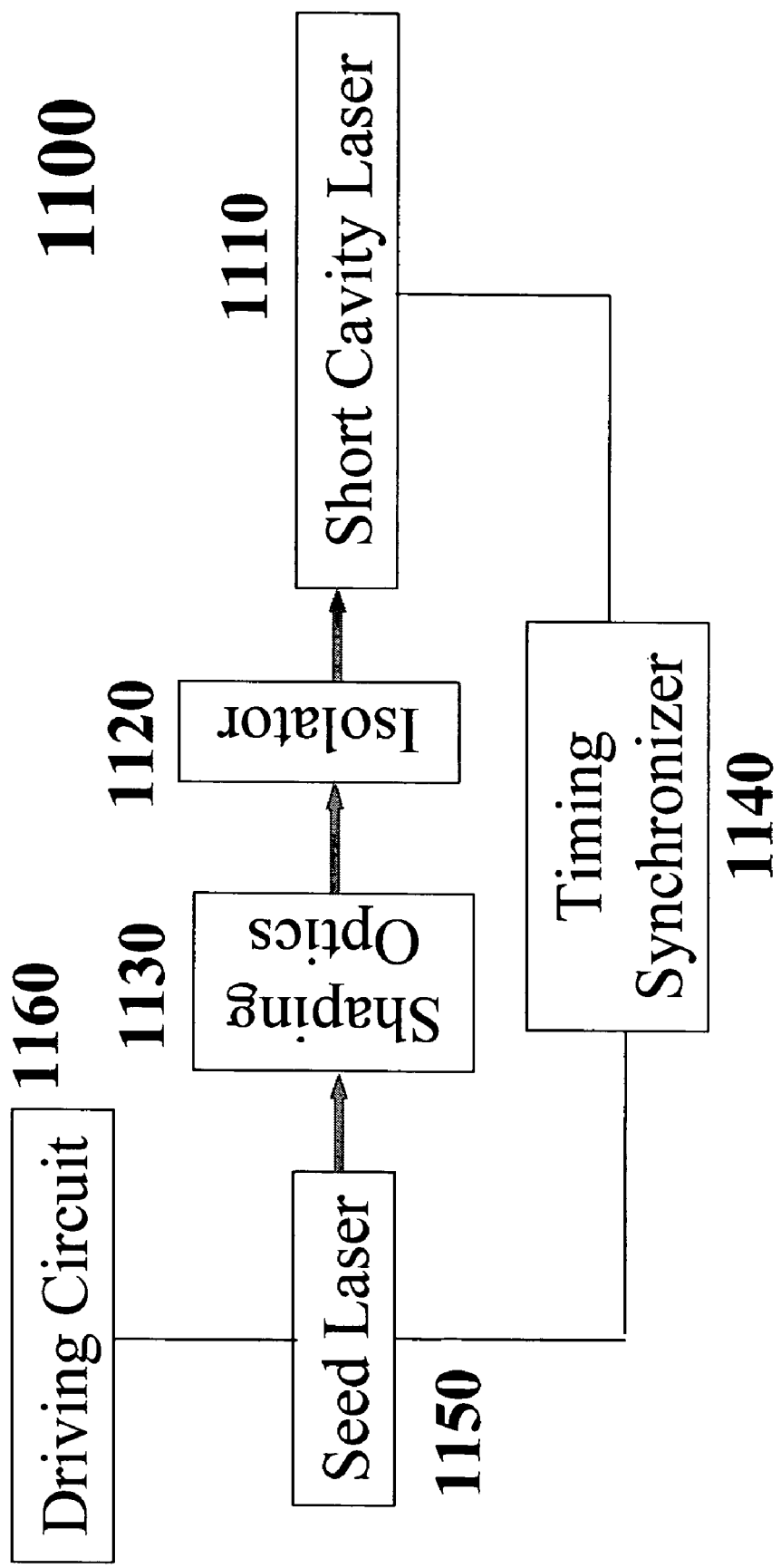

RADIO FREQUENCY MODULATION OF VARIABLE DEGREE AND AUTOMATIC POWER CONTROL USING EXTERNAL PHOTODIODE SENSOR FOR LOW-NOISE LASERS OF VARIOUS WAVELENGTHS

CROSS REFERENCE TO RELATED APPLICATION

This application claims the benefit of U.S. Provisional Application No. 60/665,175, filed Mar. 25, 2005, which are hereby incorporated by reference in its entirety.

FIELD OF THE INVENTION

This invention relates in general to low-noise lasers, and, in particular to laser diodes stabilized by a radio frequency (RF) modulator with variable degree of modulation and an optical power monitoring feedback control system using front-facet photodiode external to the laser assembly.

BACKGROUND OF THE INVENTION

Stable laser output, both in intensity and wavelength, is desirable in many applications. Laser optical scanning systems, for example, generally allow intensity fluctuation of 1% or less to avoid visible irregularities in images. In videodisk systems, mode hopping causes variations in the location of data written to the optical disk because dispersion causes variations in beam direction and reduces the signal-to-noise ratio, which degrades the quality of the picture derived from the disk. In laser raster printing systems, objectionable artifacts, such as streaks and spots, due to unwanted variations in laser energy delivered to photosensitive media can significantly deteriorate the image quality.

Optical memory devices typically use laser diodes for reading and writing digital data. Back talk noise induced by the resonance phenomenon between the laser diode and the surface of the memory medium can reduce the signal-to-noise ratio of the light output, especially at low output level. The requirements for low-noise laser output may also be very stringent for biomedical imaging and other applications. For example, the tolerance for dynamic intensity fluctuations of a computed radiography scanner may be less than fractions of 1%. In telecommunications, the switching from one mode to another affects the maximum data transmission rate. In laser display, inspection, and lithographic systems, speckle is a common cause to affect image resolution. When used as seed lasers or pump sources for laser diode pumped solid-state lasers (generally referred as DPSS lasers) or optical parametric oscillators/amplifiers (OPO/OPA) or fiber amplifiers/lasers, laser diodes may transfer their optical noise, whether due to intensity or wavelength, to the target laser, causing population inversion fluctuation. Stable intensity and wavelength are also required for harmonic generation and sum/difference frequency generation processes.

Output stability of laser diodes in both intensity and wavelength can be affected by a number of parameters such as operation temperature, driving current, optical feedback, and aging.

Laser diode operating temperature variations can cause laser intensity and wavelength fluctuation because, for a typical laser diode, the mode wavelengths drift with temperature at about 0.06 nm/° C., while the gain peak wavelength shifts at about 0.25 nm/° C. As a result, laser hops from one mode to another. Optical noise thus induced can be as high as several hundred percent of the total signal. Mode hop and mode partition occur randomly among competing modes when their dominance alters. In order to keep laser diode in its stable operation range, a thermoelectric controller, typically consisting of a temperature monitoring section and a temperature feedback control section, is commonly used. For instance, an automatic temperature control system with the accuracy of ±0.5° C. is disclosed in U.S. Pat. No. 6,590,912. This conventional control method, however, has only limited effects on stabilizing laser optical power due to, e.g., ineffectiveness to fast fluctuations and changes in characteristics of some components associated with laser diode aging. In addition, thermoelectric controller is complex and relatively expensive.

Fluctuations in driving current may also cause laser operation unstable in respect of both optical power and wavelength. One way to stabilize laser output power is the use of automatic power control. Such power supply systems typically utilize photoelectric-conversion devices such as photodiodes for detecting laser output and generating feedback signal to the laser diode driver. With this method, the average power of light emitted from the laser diode equals the predetermined value. The limitation of this method includes ineffectiveness in prevention of laser diode from mode hopping or mode partitioning and possible artifacts introduced by parameter shifts with age. Additional artifacts may be induced when back facet photodiodes are utilized for detecting laser output power, which is, unfortunately, the conventional sensing method at present. Coatings for the back mirror having a high reflectivity consists of Bragg stacks, which are pairs of layers with high and low refractive index. The back facet transmittance depends on the match between the quarter-wave length and the thickness of each layer for constructive interference in the stacks. It is generally susceptible to operational conditions such as temperature and diode injection current.

Another unstable factor is optical feedback, that is, any unwanted light reflected back into a laser system by beam forming/shaping optics, laser crystals, or any other optical elements external to the laser. Optical feedback is a persistent problem for laser diodes. Because of their optical characteristics and small size, laser diodes tend to produce a divergent cone of light. In order to produce a well-collimated beam, additional optics is needed, which will inherently cause reflections and feedback. Optical feedback can disturb laser diode operation mode via depopulation of certain lasing levels of the gain medium and change of the gain threshold, deteriorate coherence, and cause fluctuations in intensity and wavelength. The interference between the feedback light and the cavity primary light may split the laser emission spectrum. Optical feedback may also deteriorate the linear relationship between the drive current and laser output, which has an impact to the automatic power control and even causes parasitical oscillation. The latter occurs when the phase of feedback is inverted, a phenomenon called laser diode kinking.

Aging effects include characteristic changes of hardware components and/or optical elements due to degradation and contamination. Over the operating life, some parameters may shift, causing control components, e.g. thermoelectric controllers, ineffective. Changes in reflectance and/or light scattering from particulates may exacerbate optical feedback.

In a DPSS laser, optical noise of the pump diodes may cause instability of the solid-state laser through fluctuations in the pumping intensity and/or wavelength, as well as optical feedback. This is particularly true for a laser gain medium with a narrow absorption band: a shift in diode output wavelength, as a result of, e.g., mode hop, may lead to spectral mismatching of the pumping source with the gain medium.

These instability problems cannot be completely solved by means of conventional automatic temperature feedback control and optical power feedback close loop control or laser drive current control. In fact, neither operation at constant injection current, constant temperature nor constant optical output power suffices to avoid mode hoping, mode partitioning, and unwanted optical feedback.

One approach to stabilization of laser output relies on single longitudinal mode (SLM) operation. In order to maintain laser diode in SLM and mode-hop free operation, a conventional method is based on phase coherence through, e.g., an external laser cavity in conjunction with wavelength-selective feedback from grating or externally coupled cavity. Such laser diode systems usually have relatively large sizes, high costs, less robustness, and require of sophisticated laser current and temperature control, which are not suitable to many original equipment manufacture (OEM) customers. As a matter of fact, highly coherent light sources in many applications are not necessary or even not preferred. Another inherent drawback of the method relates to its ineffectiveness when the pass band of the wavelength selection element is broader than the interval between two adjacent wavelengths of the laser diode Fabry-Perot modes.

A more attractive strategy is based on the opposite philosophy, i.e., intentional decrease of the laser coherence, so that phase related optical noises can be washed out. With this method, the drive current changes rapidly and constantly in such a way that there is no particular longitudinal mode preferable. In other words, the laser operates in a multimode spectrum, normally containing a large number of longitudinal modes. Although the intensity of each individual mode fluctuates all the time, the averaged output essentially keeps unchanged and the overall optical noise decreases significantly.

There have been a number of attempts at controlling laser drive current based on high frequency, e.g. RF, modulation. In such control systems, the drive current is loaded to the high frequency signal generated by a local oscillator so that the superposed current periodically crosses the threshold level. Below this level, the laser diode is off. When the current exceeds the threshold, it turns on the laser. With repeated on-off operation at high frequency, the laser operates in multiple modes because there is not enough time for the completion of mode competition. As a consequence, the signal-to-noise ratio at low laser output can be improved. In fact, there have been several investigations on the application of RF stabilization to optical data reading/writing systems. Exemplary disclosures can be found in U.S. Pat. Nos. 5,175,722; 5,197,059; 5,386,409; 5,495,464; and in particular U.S. Pat. No. 6,049,073. In the last reference, laser output of approximately 20 to 100 mW has been obtained with the use of RF injection. Unfortunately, due to the sine waveform of the RF drive current, this type of stabilization schemes allows only 50% duty cycle. It is not suitable to high power lasers because this would overdrive the laser and decrease its lifetime. In extreme cases, there is a possibility for the power supply to back-bias the laser diode and even destroy it.

In an attempt to extend the above-discussed RF stabilization scheme to high power region, Roddy and Markis, in U.S. Patent Application Publication Nos. 2003/0128725 and 2002/0125406 and U.S. Pat. Nos. 6,625,381 and 6,999,838, have invented a control system, which allows a laser diode to operate predominantly above the threshold. Specifically, the injection circuit generates a radio frequency waveform, which provides a drive current that varies between the point slightly below a lasing threshold and a level above a DC bias point. Since the drive current is asymmetric about the DC bias, a duty cycle, which is greater than 50%, can be achieved. Therefore, a high average laser output power can be obtained without the risk of exceeding the maximum rated current, $I_{max}$. Unfortunately, the RF waveforms generated from their inventive system provided for such a modulation degree that may be ineffective to certain devices. These laser devices include blue or violet diodes, which require the drive current drops far below the threshold to completely turn off the laser and eliminate the memory. More importantly, the injection circuits in their inventive system are impractical due to the incapability of responding to RF signals with the desired performance. In particular, due to the limitations of the electronic components, the shunt modulator circuit disclosed in their patents may not be able to rapidly turn the laser diode on and off as anticipated. Another shortcoming of their invention was related to the use of back facet photodiode for monitoring laser output. Fluctuations in the temperature and/or drive current may introduce additional noise through the temperature/wavelength-dependent back facet mirror transmittance and the automatic power control loop. Moreover, the system disclosed in their patents was subject to undesirable optical feedback.

Stabilization of laser sources for pumping solid-state lasers or fiber amplifies/lasers was investigated by Ziari et al. in U.S. Pat. No. 6,215,809. By the use of a dither circuit, coherence collapse is achieved and the laser source is repeatedly perturbed from one operating mode to another at a rate that is too high for the gain element to response. In the U.S. Pat. No. 6,240,119 issued to Ventrudo, kink-free operation was achieved by repetitive switching between the states of coherence and coherence collapse through variations of the drive current amplitude at a rate considerably higher than the reciprocal of the relaxation time of the excited state of the optical gain medium, which is typically from several microseconds to milliseconds.

Application of RF modulation to second harmonic generation (SHG) is described in, e.g., U.S. Pat. No. 6,678,306. Dependence of the SHG efficiency on the modulation frequency and degree were investigated. Because the degree of modulation adopted by Sonoda was rather deep, the bandwidth of the primary laser spectrum was wider than the phase matching tolerance. Consequently, an external oscillator including a narrowband filter for wavelength selection was used in order to realize the quasi-phase matching of the SHG. In another work, as disclosed in U.S. Pat. No. 6,385,219, Sonoda has investigated DPSS laser stabilized by RF modulation.

In spite of these efforts, a large room for further improvement of laser stabilization still remains to be filled. In particular, the stabilization methods of the prior art are subject to variations in the environmental conditions and are not applicable to short wavelength diode lasers such as violet or blue laser diodes or diode modules. The successes in stabilizing DPSS lasers and fiber lasers are very limited. To date, the RF modulation, as described in the prior art, produces only broadband, multimode laser output. Because of this limitation, the prior art has not been very successful in applications requiring stable narrowband or single longitudinal mode laser sources. Examples of such applications include high-order harmonic generation and Raman scattering. In addition, no attempts have been made to stabilize slave lasers in the absence of complex cavity length control and phase locking schemes. Moreover, the prior art has not disclosed the critical role of appropriately selecting the laser operation parameters. As a result, optical noise associated with mode hop and/or mode partition may still occur. Our invention advantageously addresses these deficiencies and enables relatively compact and low-cost high power solid-state lasers, which can be operated stably and reliably at various wavelengths, from near infrared to the entire range of visible, in single or multi mode.

SUMARRY OF THE INVENTION

Accordingly, we have invented a compact laser device, which can produce high output power in single or multi mode, covering a wide wavelength range, with both stability and reliability. The inventive stabilization scheme is based on improved automatic power control system and intentional change of laser drive current at high frequency such as radio frequency to eliminate or greatly reduce mode-hop induced noise.

According to our invention, the laser drive current is modulated by a sine wave or a rectified sine wave or other waves, preferably having high duty ratio, or by a series of narrow pulses with negative polarity, or is repetitively shunted at radio frequency. Advantageously, the degree of modulation can be optimized to meet various requirements of different applications. These applications include, but are not limited to, high duty cycle for high power laser output, broadband multimode laser spectrum, and narrowband or single mode laser spectrum. In addition, the laser diode module can be operated in continuous wave or pulsed modes. In the latter case, a matching between the modulation frequency and the pulse frequency is preferred.

According to our invention, the automatic optical power control consists of laser output monitoring, photo-electron conversion, and a feedback loop to adjust the bias based on the detected signal. In contrast to the prior art, which utilized back facet photodiodes to detect laser output and feedback signal to the control circuit, the inventive laser structure senses the output power of laser diode through an external monitor photodiode. With the inventive structure, the photodiode accepts only light from the front facet of laser diode, which eliminates perturbations from any stray lights. Instabilities associated with unwanted optical feedback and changes in environmental conditions such as temperature thus can be remedied.

According to our invention, stable DC bias in conjunction with temperature control through, e.g. thermoelectric controller, can be employed, as an alternative to the automatic power control system, for wavelength and intensity stabilization. Stable DC bias can be obtained by a current feedback loop. This stabilization scheme does not use photodiode sensor and is especially of merit for applications requiring stable narrowband laser spectra.

According to our invention, temperature control can be eliminated in some applications. This further reduces the system complexity and cost.

According to our invention, laser noise associated with mode hop due to temperature variation is shifted to high frequencies and will not be noticeable. High frequency intensity fluctuation cannot be detected by photodiodes characteristic of slow response. Only slow signals, which represent true drifts in the laser output power rather than hops in laser wavelengths, are fed back into the control circuit to make appropriate adjustments of the current supplied to the laser. Because the laser operates at a stable spectrum, problems related to variations in optical surface reflectivity, which is generally wavelength-sensitive, are essentially solved. Warm-up or equilibration time is no longer required.

According to our invention, optical noise can be further reduced by appropriate combination of the static laser operation parameters. Mode hop and/or mode partition cannot be completely eliminated by RF modulation, unless the static laser operation parameters fall into a stability zone.

Compared with the prior art, the present invention exhibits several important advantages. In one aspect, the inventive automatic power control loop is less perturbed by fluctuations in the temperature. In addition, it effectively suppresses detrimental effects from unwanted optical feedback, which is an important noise source for laser diodes, laser diode pumped solid-state lasers or fiber amplifiers/lasers or thin-disk lasers, and seed lasers, with or without nonlinear frequency conversion processes.

In another aspect, the inventive RF modulator can be integrated into a variety of systems for various applications. It is capable of stabilizing laser outputs over a broad range of wavelengths, from ultra-violet to near IR. Prior art schemes for laser stabilization have not been successful for short wavelength lasers such as blue or violet laser diodes. This is attributed to the fact that optical noises generated from lasers operating at different regions of wavelength stem from different mechanisms and, consequently, require different modulation degrees. Optical noise in red lasers is mainly generated by mode hop. For blue or violet lasers, mode partitioning is the primary noise source. An additional challenge for stabilizing short wavelength lasers is associated with strong Amplified Spontaneous Emission (ASE) and a relatively narrow range of operating current, making optimal modulation difficult.

In another aspect, the inventive RF modulator is capable of reducing or eliminating laser speckles without the use of mechanical means or diffusers. This reduces the complexity and minimizes the energy loss. According to our inventive teachings, stable multiple longitudinal lasing modes of low coherence can be produced. Each mode exhibits a different speckle pattern. A superimposition of these modes suppresses the appearance of image speckle.

In yet another aspect, the inventive RF modulator and automatic power control loop is adaptable to various applications such as injection seeding, nonlinear frequency conversion, and Raman scattering. In particular, this is the first time to inexpensively realize stabilization of narrowband or single mode laser through injection of RF modulated drive current.

The invention, as well as its objects and advantages, will become more apparent from the drawings and detailed description presented hereinafter.

BRIEF DESCRIPTION OF THE DRAWINGS

FIG. 1 is a perspective view of an RF stabilized laser device according to the present invention;

FIG. 2 is a block diagram of optics configuration according to the present invention;

FIG. 3B is a schematic view of a laser diode module with an automatic power control system according to the present invention;

FIG. 5A is a graph showing waveforms of the drive current with sine modulation of various degrees and the corresponding waveforms of the optical output;

FIG. 7A is a graph showing waveforms of the drive current with narrow-pulse modulation of various degrees and the corresponding waveforms of the optical output;

FIG. 7B is a functional block diagram of a drive circuit generating injection current modulated by narrow pulses according to the present invention;

FIG. 8 is a graph showing test results for laser output power stability, the laser is stabilized according to the present invention and is in an environment experiencing temperature cycles;

FIG. 11 is a schematic graph of a short cavity solid-state laser, in conjunction with a seed laser constructed in accordance with the present invention;

DETAILED DESCRIPTION OF THE PRESENT INVENTION

Figure 3A:
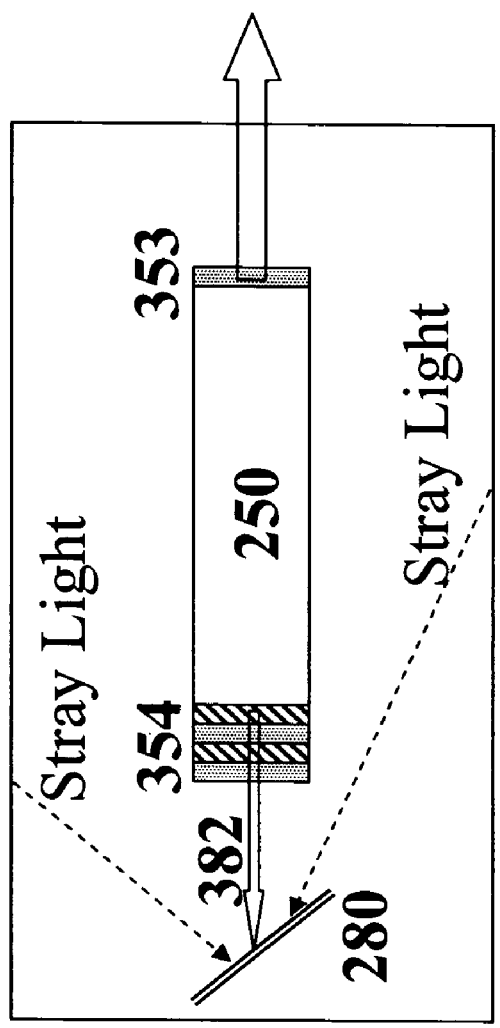
FIG. 3A is a schematic view of a laser diode module with an automatic power control system according to the prior art.

As will be described in more detail hereafter, there is disclosed herein a compact laser device stabilized by RF modulation of variable degrees and optical power control system using front-facet photodiode external to the laser assembly.

Referring to drawings and in particular to FIG. 1, wherein a perspective view of an exemplary laser system constructed in accordance with the present invention is shown. The laser device 100 consists of a laser diode assembly 150, a photodiode assembly 180, a telescope 171, an additional lens 172, a collimation lens 140, and an RF circuit board 160, all contained in housing 110 and covered by a control circuit board 120. The laser diode assembly 150 is composed of a laser diode and an optional temperature control module, not shown in this graph. A photon-to-electron conversion device such as photodiode (not shown in this graph) is contained in the photodiode assembly 180. The telescope 171 and the lens 172 form a beam-shaping element. While most of the laser beam emitted from the laser diode outputs through the telescope 171 and the lens 172, a faction of the light is directed to the photodiode assembly 180 and provides a feedback signal to the control circuit board 120. It is understood that elements that are not specifically shown or described may take various forms well known to those skilled in the art. It should also be noted and understood that our invention is not limited to the system shown in FIG. 1. As a matter of fact, various laser systems can be made based on our inventive teachings.

FIG. 2 shows a block diagram of an optics configuration of the inventive laser system illustrated in FIG. 1. The arrows indicate the laser light path. The radiation emitted from the laser diode 250 is collimated by the lens 140. The beam splitter 283 directs a fraction of laser output 281 to the photodiode 280, wherein the optical signal is converted to electrical current. The generated electrical current is then fed back into the automatic power control circuit in 120. A majority of the laser power is directed towards the beam shaping optics 170, composed of the telescope 171 and the lens 172. A stabilized laser beam 101 is thus produced.

FIG. 3A shows a back-facet photodiode configuration in the prior art. The back facet 354 is a Bragg reflector consisting of pairs of layers with high and low refractive indexes. For perfect constructive interference, as required by high reflectivity, the thickness of each layer is designed to be the quarter wavelength of the laser in that material. A photodiode 280 detects light 382 extracted from the back facet of the laser diode 250 and provides a feedback signal to the control circuit for adjusting laser output power. Since the layer thickness and the refractive index of the material both depend on the temperature, the actual reflectivity and the peak reflective wavelength of the back facet are sensitive to the ambient temperature and the laser operation current. A small variation in the mirror reflectivity may introduce significant change in the luminous flux entering the photodiode. As a consequence, fluctuations in the temperature and/or drive current are translated into photodiode current, causing optical noise. Another shortcoming of the prior art is that the photodiode is exposed to the laser assembly environment and may pick up stray lights during the monitoring, which introduces additional noise. In mathematical expression, the photodiode current $I_p = \kappa(t_b \Phi_l + \Delta t_b \Phi_l + \Phi_s)$, where $\kappa$ is the photo-electron conversion efficiency, $t_b$ is the transmissibility of the back facet, $\Delta t_b$ is the transmissibility change due to temperature/current fluctuations, $\Phi_l$ is the laser flux, and $\Phi_s$ is the flux of stray light delivered into the photodiode. Optical noise is generated from the second and third terms, which deliver erroneous signal to the feedback loop. Since the transmissibility of the back facet is inherently low, a small change in $\Delta t_b$ may lead to significant noise.

In contrast to the prior art and as can be seen from FIG. 3B, the present invention detects light from the front facet 353 by using the photodiode 280, which is mounted on the top surface of the box 380 with the aperture 383 facing down towards the box interior. There are other two apertures on the box 380: one (381) is for input light and the other (382) is for output light. Contained in the box 380 is the beam splitter 283. The photodiode assembly 180 is represented by a dotted rectangle. With this configuration, the photodiode sensor is external to the laser assembly 250. In operation, the light 301, which is extracted from the front facet 353, enters the box 380 through the aperture 381. The beam splitter 283 directs a fraction of the light, labeled as 303, to the photodiode 280 for monitoring. Mathematically, the photodiode current can be expressed as $I_p = \beta \kappa(t_f \Phi_l + \Delta t_f \Phi_l)$, where $t_f$ is the transmissibility of the front facet and $\beta$ represents the ratio of the split light 303 to the total laser light 301 extracted from the front facet 353. Compared to the sensing scheme in the prior art, the signal received by the photodiode from the front facet is relatively less influenced by fluctuations in the temperature because $t_f$ is much higher than $t_b$. This reduces optical noise associated with variations in the mirror reflectivity and transmittance. Moreover, according to our inventive teachings, the photodiode accepts only light representing the actual optical power, and is isolated from stray lights. This eliminates possible optical feedback and further improves the noise performance.

Figure 4A:
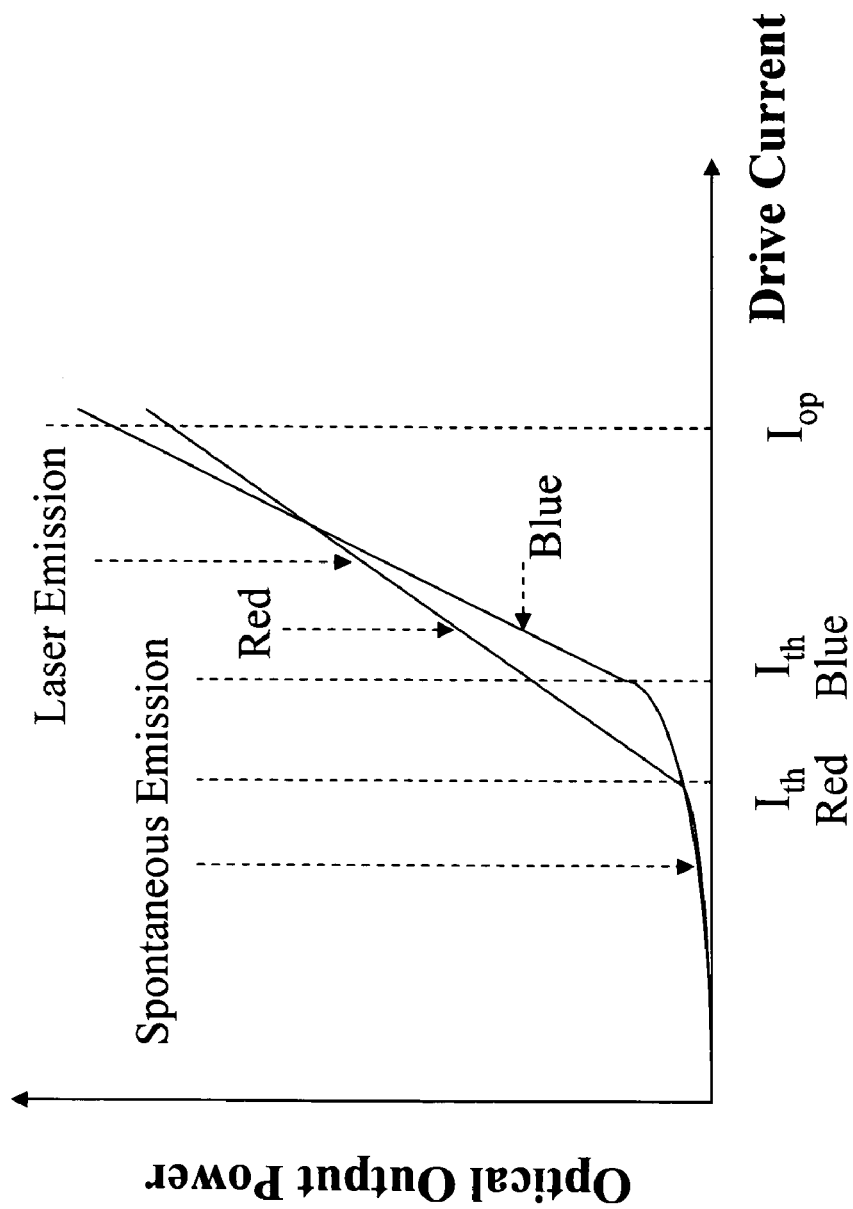
FIG. 4A shows a comparison of the characteristic curves describing optical output power versus drive current for red and blue diode lasers.

Before detailed discussion on the RF modulation, it is worth to review some important features of laser diodes. First discuss the characteristic curves of optical output power versus drive current for lasers operating at various wavelengths. As an example, the characteristic curves for red and blue laser diodes are conceptually shown in FIG. 4A. Below lasing threshold, these devices work like an LED with undoped recombination zone. Under otherwise identical conditions, the lasing threshold increases with the frequency, while the damage threshold typically decreases with the frequency and drops off rather sharply for wavelengths of 500 nm or shorter. This means that the available range of operating current becomes narrower as the wavelength reduces. It is, therefore, difficult to reach optimal modulation for short wavelength lasers such as blue or violet laser diodes by the use of a sine waveform or other waveforms produced in the prior art. Another challenge for stabilizing blue or violet lasers relates to spontaneous emission, which tips the balance first in favor of one or few mode(s) and then the other(s). In such laser systems, the ASE may be still appreciable near the threshold and act as an injection seeder, leading to operations of SLM or few modes. The prior art is incapable of solving this problem because the modulation does not have sufficient depth to completely suppress ASE. Of course, too deep a modulation may reduce the duty cycle ratio or even cause the peak current exceeding the tolerable limit. Unfortunately, different laser diodes may have different thresholds to eliminate the memory of the previous operation and suppress ASE.

This problem can be solved by optimizing the modulation degree. In particular, the drive current with a waveform, which periodically reaches a near zero or slightly below zero level to completely suppress any ASE and eliminate memory, can be employed for blue or violet lasers. It is, however, important to keep the drive current above the level at which laser damage due to back bias may occur. In order to protect the laser diode from damage, an electric circuit is integrated into the RF modulator, according to the present invention.

Figure 4B:
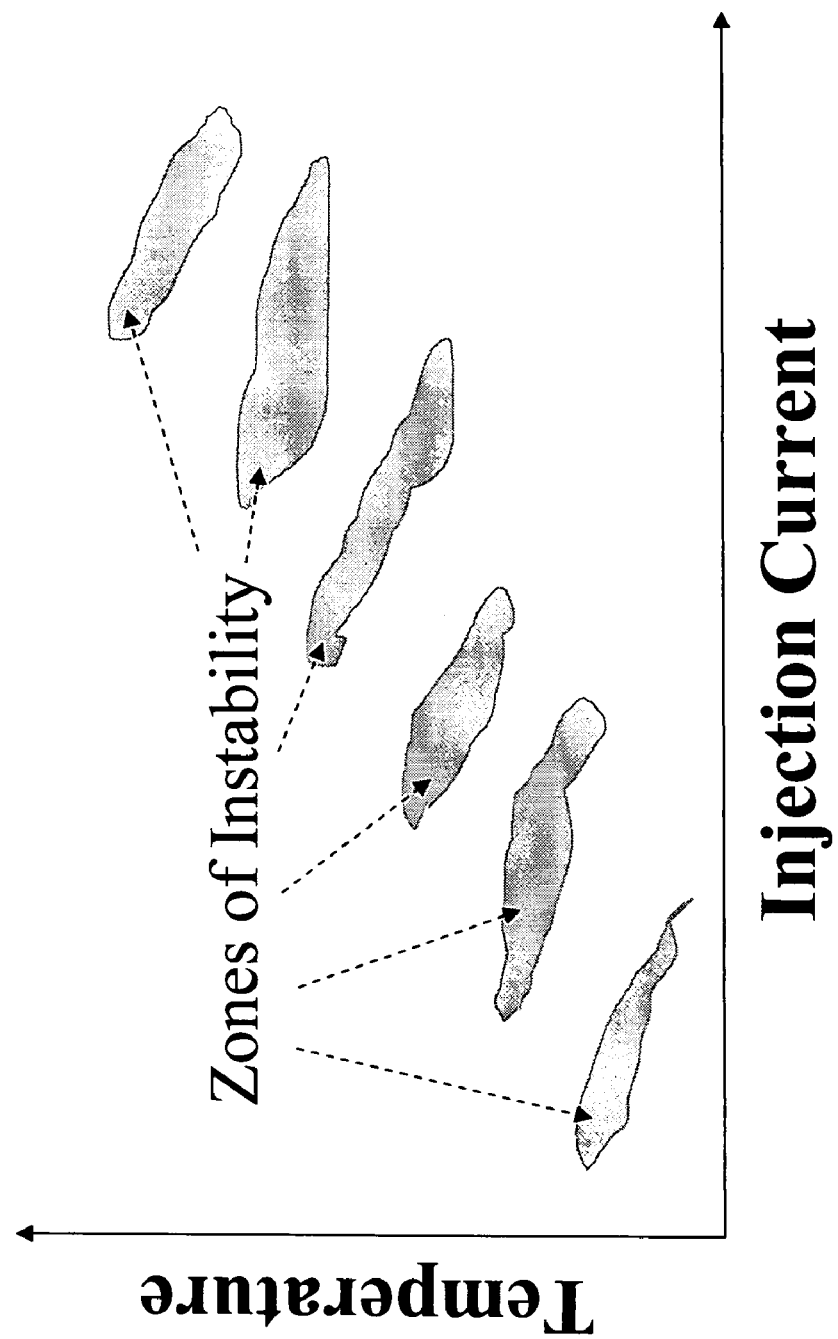
FIG. 4B shows stability map of a typical laser diode, plotted in the current-temperature domain.

Next discuss stability map, which visualizes noise performance of a laser diode in the current-temperature domain. A conceptual illustration is given in FIG. 4B. The gray areas indicate zones of instability, where mode hop occurs. The instability increases from the edge to the center. With appropriate combinations of laser operation parameters such as case temperature and injection current, it is possible to improve laser stability. Unfortunately, the stability map varies from laser to laser and may change with age. In addition, perturbations such as unwanted optical feedback and/or fluctuations in the ambient temperature may move the instability zones in unpredictable directions.

Therefore, stringent control of case temperature, injection current, and optical output power alone does not suffice to get mode-hop free, low-noise laser operation. RF modulation is helpful in stabilizing laser operation. However, mode hop or mode partition may still occur, provided that the laser is operated in or near the instability zones. This is one of the reasons why the prior art has not been very successful in practically reducing optical noise. In order to completely eliminate mode hop and/or mode partition, it is important to set the laser static operation parameters away from the instability zones and their vicinities, in addition to RF modulation of appropriate degree and frequency.

Some exemplary waveforms of the drive current are hereby plotted. FIG. 5A shows two sine waves with different degrees of modulation and the corresponding waveforms for the optical output. For modulations deep enough to swing down below the threshold, as graphically illustrated on the left hand side of FIG. 5A, the laser operates in multimode with low coherence. On the other hand, if the modulation degree is so small that the drive current is always above the threshold, the laser operates continuously without on/off interruption. A graphic illustration of the drive current, which is modulated by an RF sine wave of small amplitude is given on the right hand side of FIG. 5A. For sufficiently small modulation, the drive current dithers in the vicinity of the DC level and passes through the mode hop points so rapidly that the wavelength is continuously swept around its average. Line broadening does not happen. Drive current modulated by sine waves of small amplitudes, is particularly useful for stabilizing narrowband lasers including those operated in single longitudinal mode.

Figure 5B:
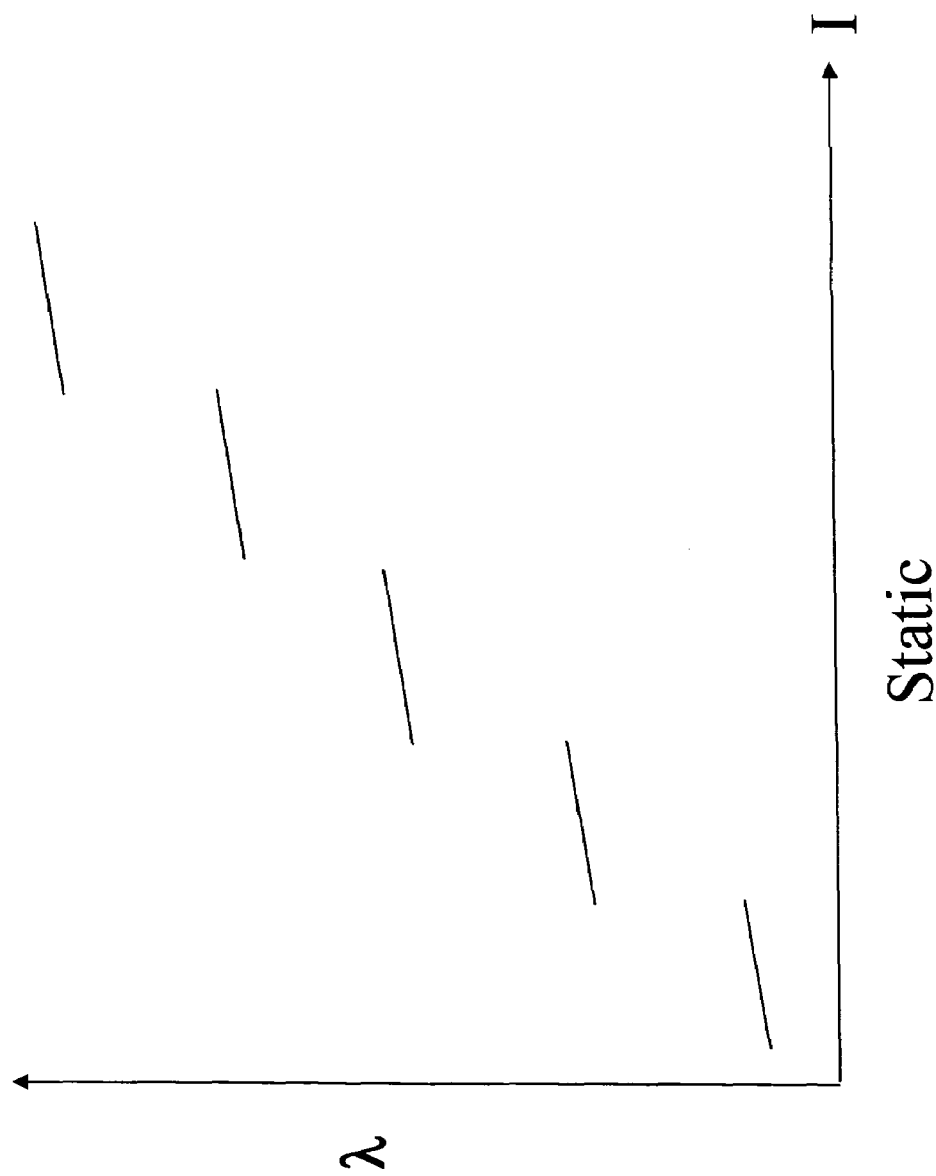
FIG. 5B is a graph showing dependence of lasing wavelength on the DC drive current.

Dependence of the lasing wavelength on the static injection current typically reveals a stair-step pattern, as shown in FIG. 5B. This is attributed to mode hop caused by variations in the optical length and gain profile. For AlGaAs lasers, the slope within each step is in the vicinity of 0.007 nm/mA. From one step to the next, the gap is about 0.25 nm, corresponding to the mode spacing. By changing the injection current at a constant ambient temperature, the wavelength shifts from one longitudinal mode to the next at certain currents, which connect the neighboring steps. If a laser diode is driven by a DC source, mode hop may occur near these sensitive points, even if the temperature and the injection current are strictly controlled. Random mode shifts cause total intensity fluctuations and spectrum instability.

Figure 5C:
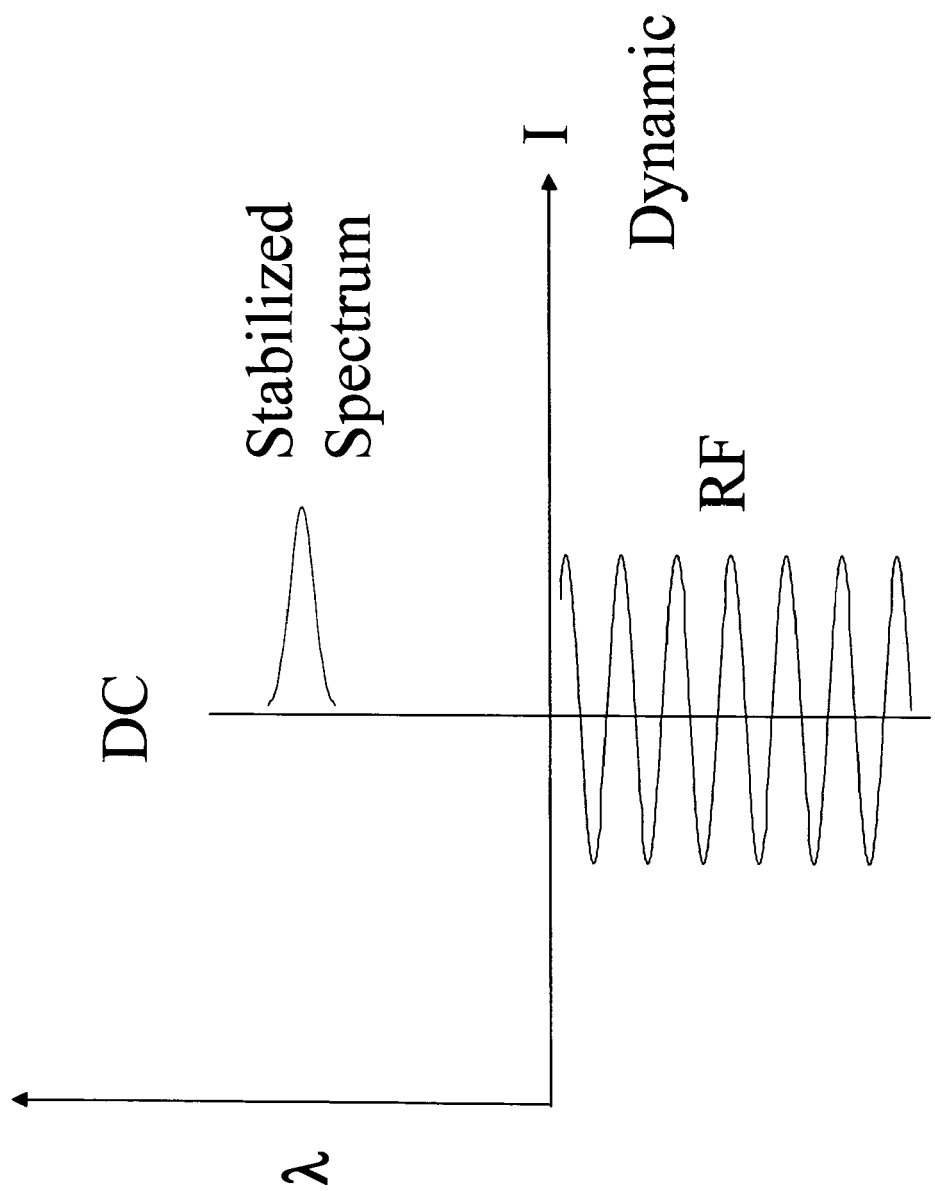
FIG. 5C is a conceptual illustration of the wavelength stabilization scheme according to the present invention.

When the drive current is dithering at a high frequency, on the other hand, the lasing wavelength sweeps over a narrow range. Averaged over time, the resultant spectrum is stable. The peak wavelength of the spectrum may slightly deviate from the mode corresponding to the DC bias, because the effective temperature, which determines the index of refraction and cavity length, as well as the band gap, changes slightly with the modulation frequency and amplitude. Lasing occurs in the mode(s) nearest the gain peak. Unlike thermal effects, which take place only slowly and are essentially averaged out in high frequency perturbations, the field-induced oscillations in the index of refraction and gain profile have high frequencies and are responsible for the bandwidth of the spectrum. This type of wavelength stabilization and noise reduction mechanism is graphically illustrated in FIG 5C. Unlike the stair-step pattern shown in FIG. 5B, which represents the static relationship between the wavelength and injection current, the stabilized spectrum, as displayed in this FIG. 5C, is a dynamic result. Although the modulated injection current, which is a sine wave in this graph, may vary over a range up to 100's of mA, mode hop does not occur. According to our inventive teachings, and as can be seen from FIG. 5A, drive current dithering can be realized by RF modulation with small amplitude.

Figure 5D:
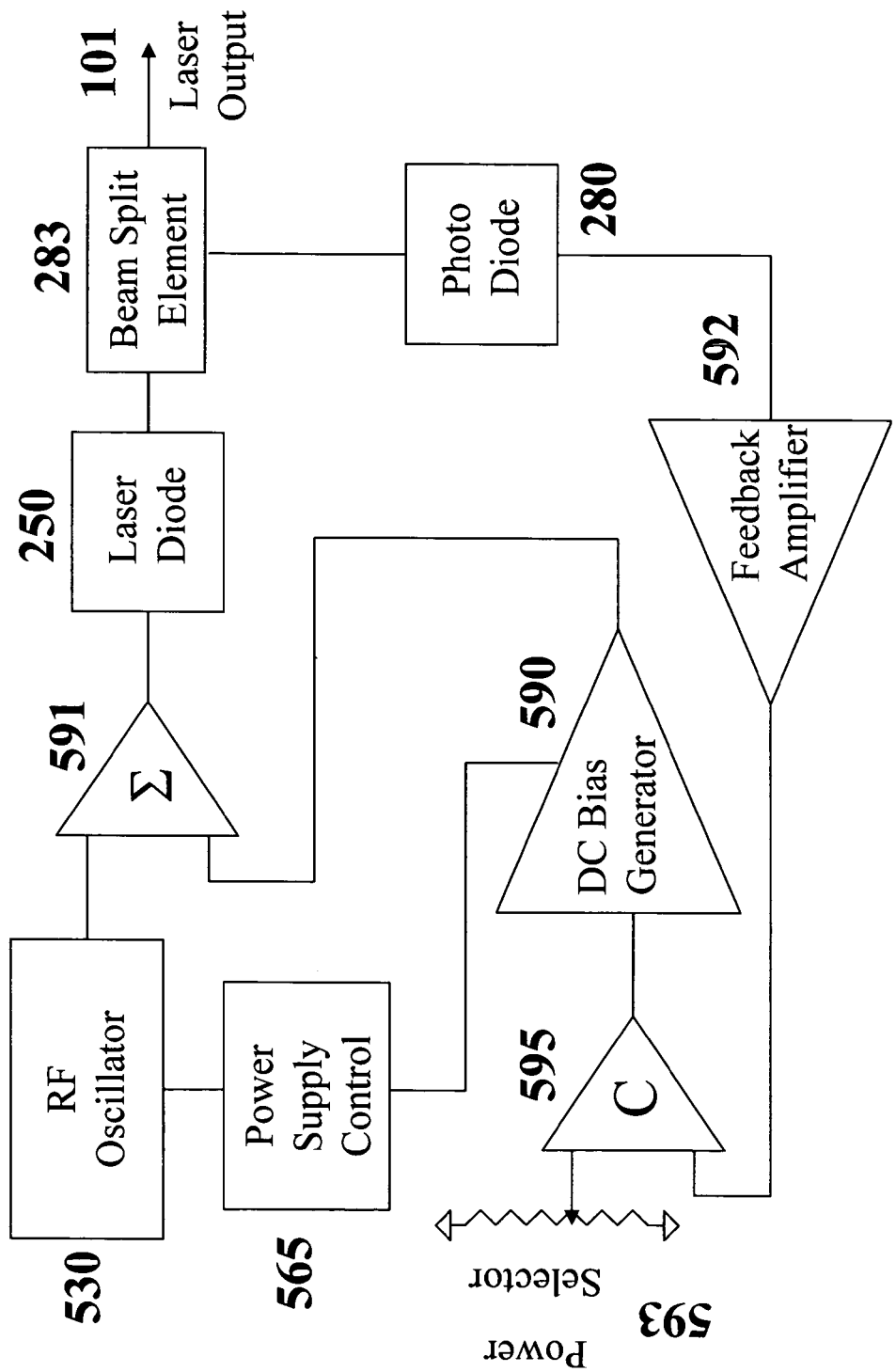
FIG. 5D is a block diagram of a drive circuit generating injection current modulated by a sine wave according to the present invention.

With reference now to FIG 5D, where a drive circuit according to the present invention is shown in form of block diagram. Sine wave with variable amplitude is generated in the RF oscillator 530 and combined with the constant current from the DC bias generator 590 in the summing junction 591. The resultant drive current with an RF waveform is injected into the laser diode 250. Through the beam split element 283, a fraction of laser emission is received by the photodiode 280 and converted to electrical signal therein. This signal is then amplified in the feedback amplifier 592 for enhancement of detection sensitivity and is compared to the value predetermined by the power selector 593 in the comparator 595 for automatic adjustment. A power supply control 565 provides a logic control for turning on/off DC and RF circuits: enabling the RF oscillator 530 only when the DC generated from 590 is within a predetermined range of values and disabling 530 before the DC generator 590 is turned off. This protects the laser diode 250 from damage due to intolerable back bias. It is understood that various substitutions and changes, in the form and details of the system illustrated and in their operation, may be made by those skilled in the art without departing from the spirit of the invention.

Figure 5E:
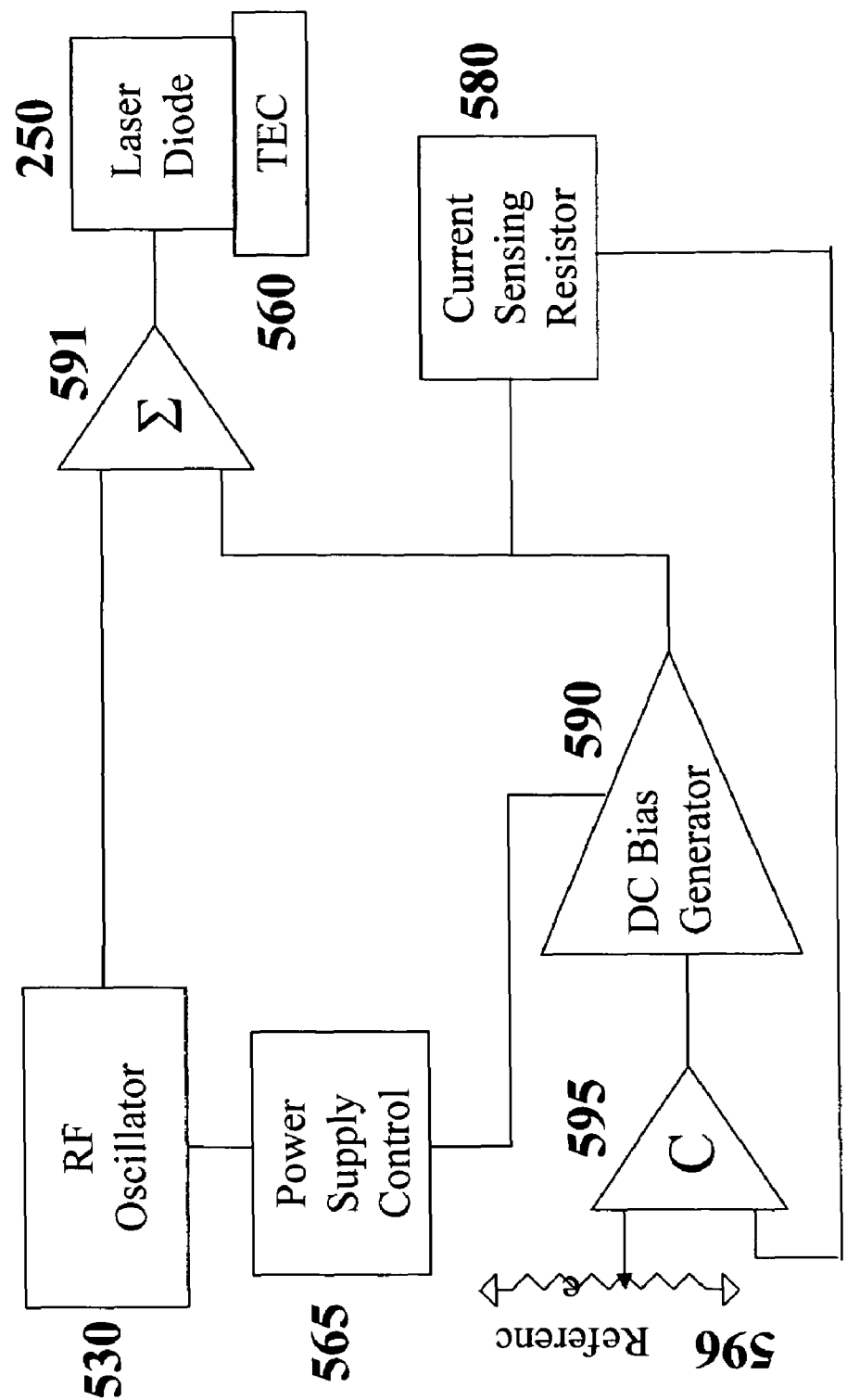
FIG. 5E is a block diagram of an alternative scheme for stabilizing laser wavelength and intensity.

Alternatively, the automatic power control system can be replaced by a stable DC bias in conjunction with a thermoelectric controller (TEC) for active temperature control. Stable DC can be obtained by a current feedback loop. An exemplary stabilization system based on stable DC bias is illustrated in form of block diagram in FIG. 5E. The DC bias generated in 590 is sampled by a current sensing resistor 580. The sampled current is compared with the predefined reference in 595, which provides a feedback signal to the DC generator 590 to stabilize the DC current.

It should be pointed out that the waveforms shown in FIG. 5A are not limited to sine waves. Other waveforms including distorted sine waves and non-sine waves can be employed for RF modulation. Non-sine waves such as square waves and saw-tooth waves can be generated by a switching element, a feedback loop, and a delaying circuit. By adjusting the DC bias and RF amplitude, these waveforms can be generated asymmetric to the bias to obtain various degree of modulation and duty cycle, as desired in actual applications.

Figure 6A:
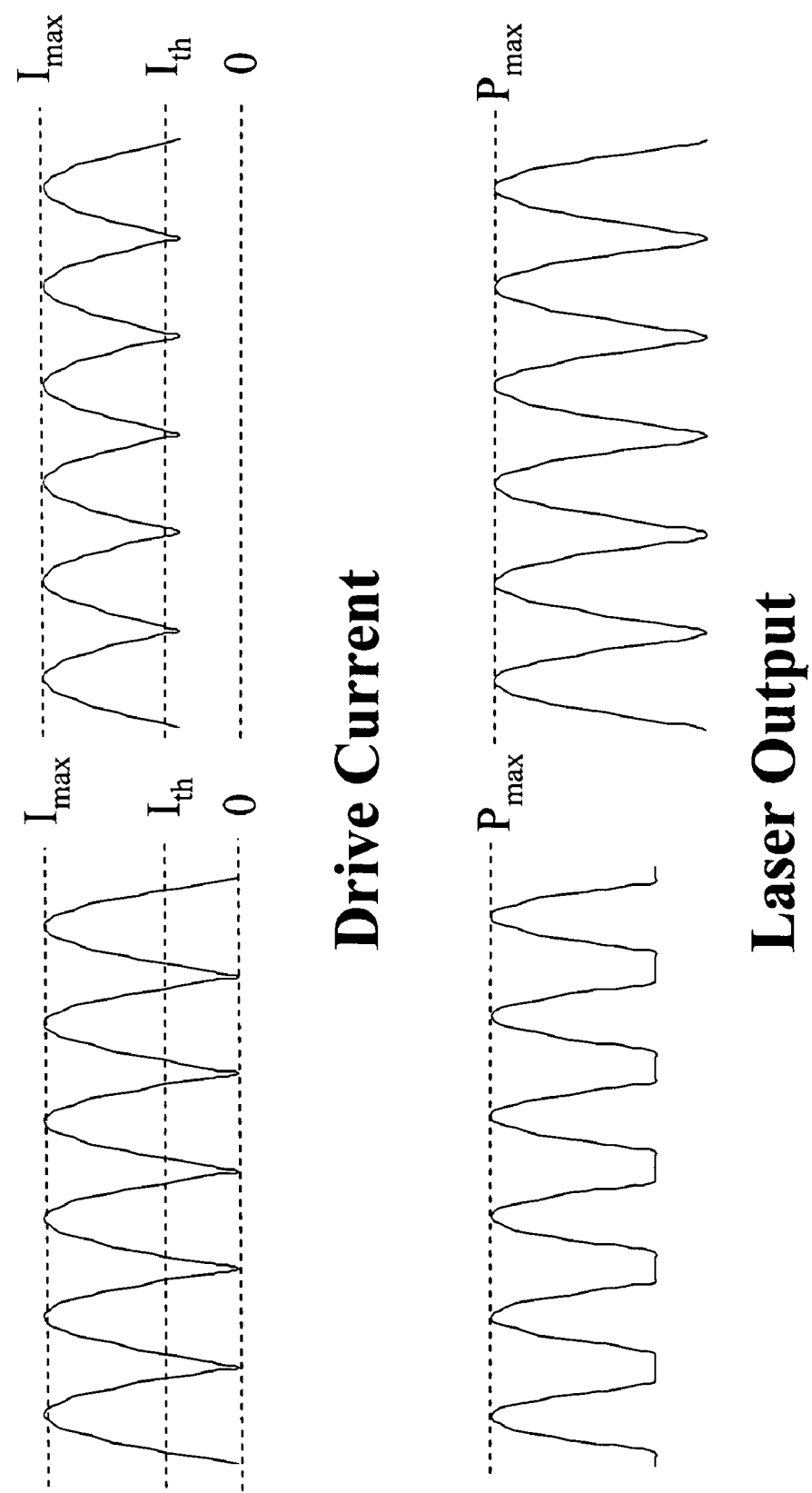
FIG. 6A is a graph showing waveforms of the drive current with rectified sine modulation of various degrees and the corresponding waveforms of the optical output.

To improve the duty cycle, a rectified sine wave expressed as $|I_m \sin(\omega t)| + I_{DC}$, where $I_m$ is the amplitude of the RF sine wave, $\omega$ is the frequency, and $I_{DC}$ is the DC bias, can be used. FIG. 6A graphically illustrates curves describing the drive current versus time and the temporal behavior of the laser output thus generated. The drive current varies between $I_{DC}$ to $I_m + I_{DC}$ with a high average value. According to our inventive teachings, the ratio of $I_m$ to $I_{DC}$ can vary to reach optimized modulation degree.

In particular, the waveform on the left hand side of FIG. 6A, corresponding to $I_{DC}=0$, has the largest modulation degree. This waveform can be applied to stabilization of various lasers including violet or blue lasers with high output power. Violet or blue lasers typically have broadband spectra. Mode partitioning, defined as fluctuations in intensity probability distributions of all longitudinal modes, is a primary noise source, which cannot be suppressed in the prior art. In addition, the prior art is incapable of solving problems associated with ASE.

On the right hand side of FIG. 6A, the waveform periodically drops slightly below the threshold to turn off the laser operation. Such waveforms are suitable for stabilizing red or IR laser diodes, in which mode hop is the primary noise source.

Figure 6B:
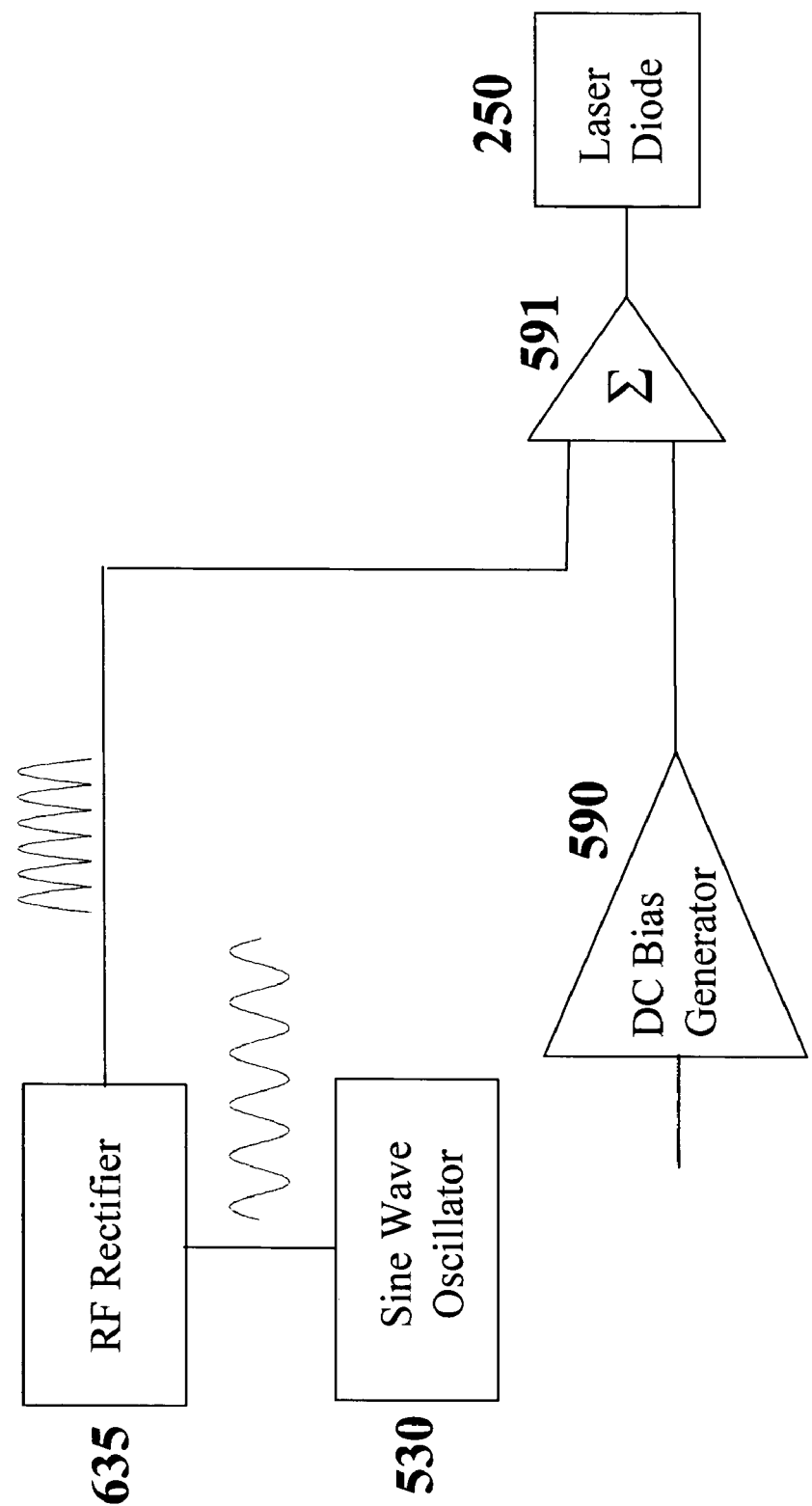
FIG. 6B is a functional block diagram of a drive circuit generating injection current modulated by a rectified sine wave according to the present invention.

A block diagram for generation of rectified sine wave is shown in FIG. 6B. An RF rectifier 635, which comprises, e.g., a pair of high frequency diodes for rectification, flips the negative part of the sine wave generated from the sine wave oscillator 530. The rectified wave with doubled frequency is then superposed with the DC bias generated from 590 in 591 to provide modulated drive current for the laser diode 250.

In an alternative configuration, the RF modulation can be realized by superimposing a series of negative pulses onto the DC bias. These negative pulses are generated by a pulse forming network, which consists of a pulse generator such as blocking oscillator for generating a series of narrow pulses with steep rise and fall and a transformer for coupling the generated pulses with the laser diode and reversing the polarity. Preferably, the transformer is capable of responding to fast pulses. FIG. 7A shows such waveforms. By adjusting the DC bias and the pulse amplitude, the degree of modulation can vary to meet the requirements of an actual application.

FIG. 7B is a functional block diagram of a modulator circuit for generating RF waveforms shown in FIG. 7A. In operation, the DC bias generated from the DC generator 590 is modulated by a series of narrow pulses generated from the pulse generator 726 with the aid of the transformer 728, which is connected with the laser diode in series. Through the transformer 726, the polarity of the narrow pulses is reversed. A Schottky device such as a clamping diode 739 is connected in parallel with the laser diode 250 so that the voltage across the laser diode 250 is secured from exceeding its safe range at any time instant.

Figure 7C:
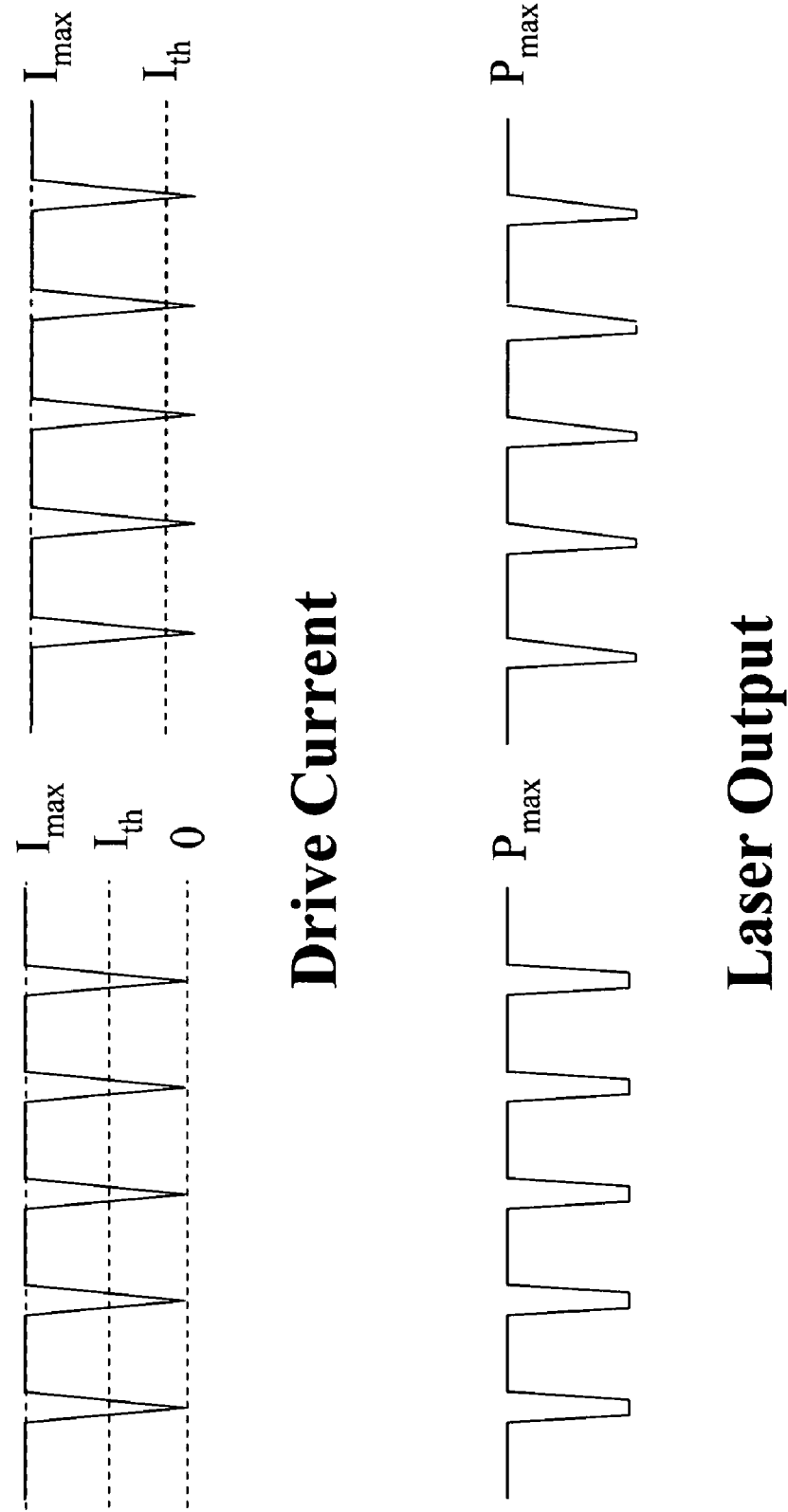
FIG. 7C is a graph showing waveforms of the drive current with shunt modulation of various degrees and the corresponding waveforms of the optical output.

Alternatively, high duty cycle RF waveform can be obtained from a shunt modulator. A schematic of such waveforms is illustrated in FIG. 7C. For the most time, the drive current keeps its maximum value, $I_{max}$. Since the shunt occurs momentarily with very short rise and fall, the duty cycle thus produced can be fairly high. The waveform shown on the left hand side of FIG. 7C has the largest shunt ratio, which is adaptable to short wavelength lasers such as blue or violet diodes. The corresponding optical output waveform, which is a series of trapezoid-like pulses with the flat bottom at the threshold, is also shown in this Figure. With reduced shunt ratio, we obtain the waveform displayed on the right hand side. A drive current with such waveform can be applied to high power red or IR lasers.

Figure 7D:
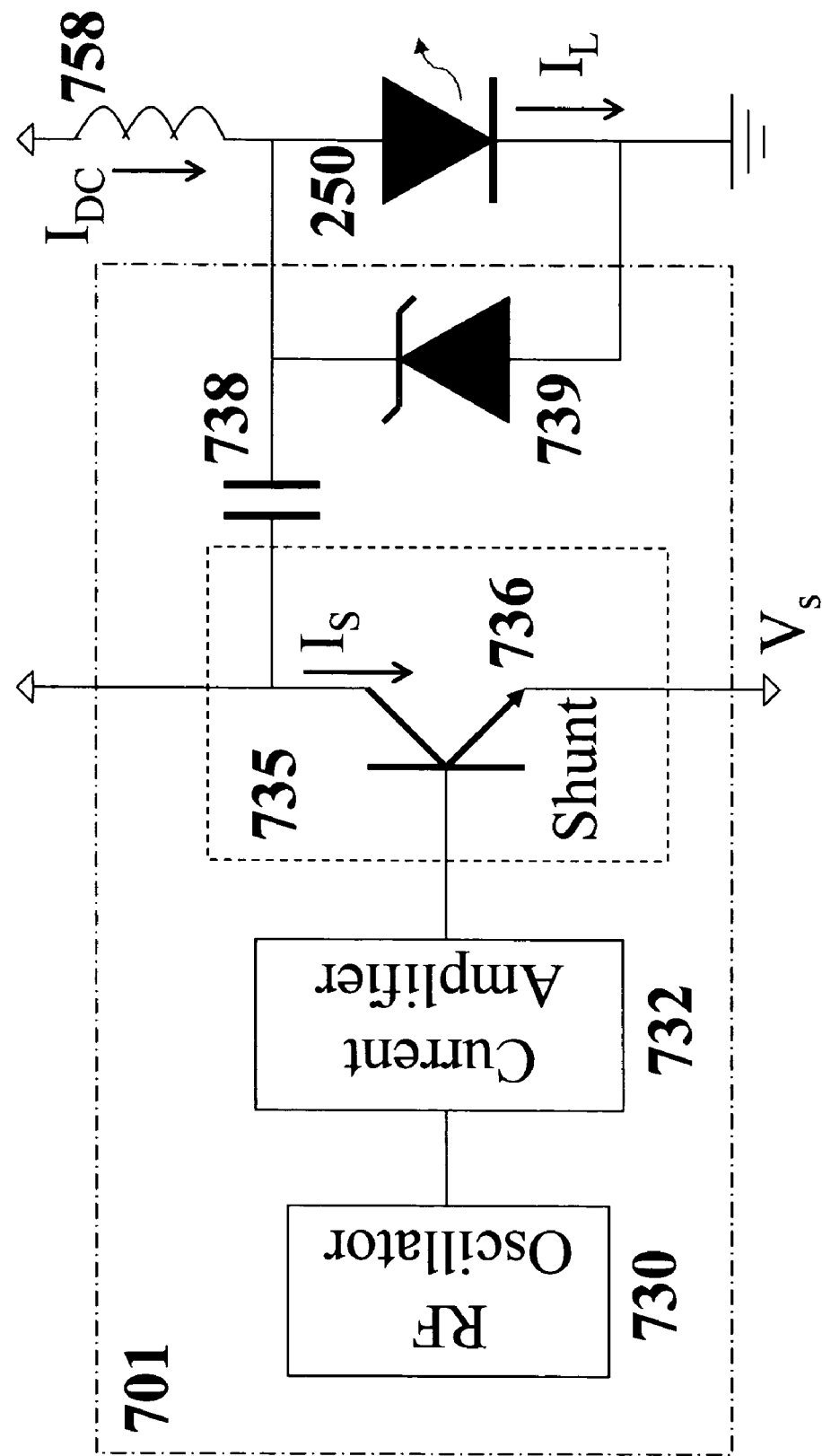
FIG. 7D is a functional block diagram of a shunt modulator according to the present invention.

FIG. 7D conceptually shows a shunt modulator constructed according to the present invention. The shunt modulator is composed of an RF oscillator 730, a current amplifier 732, and a shunt element 735. A radio frequency sine wave or distorted sine wave or square pulses or some other input signals with a desired waveform is generated in the RF oscillator 730 and amplified in 732. The amplifier 732 also functions as an impedance converter for impedance match. It then trigs an active device 736 in the shunt element 735, which is represented by the dotted rectangle in FIG. 7D. The effective impedance of the active device 736, which is an NPN bipolar transistor in this FIG. 7D but can also be other electronic devices with variable impedance or their combinations, is momentarily reduced and the shunt current $I_s$ increases correspondingly. Preferably, the active device 736 is a transistor array for improving the performance of modulation at high frequency. This results in a modulated drive current $I_L$, which can be represented by a series of trapezoids repeated at a radio frequency. The capacitor 738 couples the modulation current with the laser diode 250 while blocking $I_{DC}$ from getting to the shunt circuit. Similarly, the inductor 758 is for isolating RF signal from the DC source. Advantageously, by selecting $V_S$ the shunt ratio is adjustable so that optimized degree of modulation, as required for various lasing wavelengths, can be obtained. In this way, the drive circuit constructed according to our inventive teachings can be applied to a broad range of wavelength including IR, red, blue, and violet. As an additional advantage of this invention, the DC current $I_{DC}$ may be continuous or pulsed, depending upon specific applications. In the latter case, a matching between the modulation frequency and a harmonic or subharmonic of the DC pulse frequency is preferred. A Schottky device such as a clamping diode 739 is connected in parallel with the laser diode 250 so that the voltage across the laser diode 250 is secured from exceeding its safe range at any time instant. Parameters of modulation waveform include frequency, duty cycle ratio, modulation depth (degree), bias, and repetition rate. It should be pointed out again that the drawing in FIG. 7D is conceptual and is for illustration only.

It should also be understood by those skilled in the art that many other waveforms, preferably with high duty cycle, can be adopted for RF modulation. Variations and modifications can be brought into effect within the scope of the invention.

With reference to FIG. 8, where temporal behavior of output power for a laser stabilized according to the present invention is plotted. The laser was placed in an environmental chamber, which is temperature cycled between 15° C. and 35° C. by 0.5° C./min followed with one hour dwell. Over the 38 hours, the peak-to-peak variation is approximately 0.5%. This clearly shows that full-time low noise output can be obtained by implementing the inventive stabilization scheme.

Figure 9A:
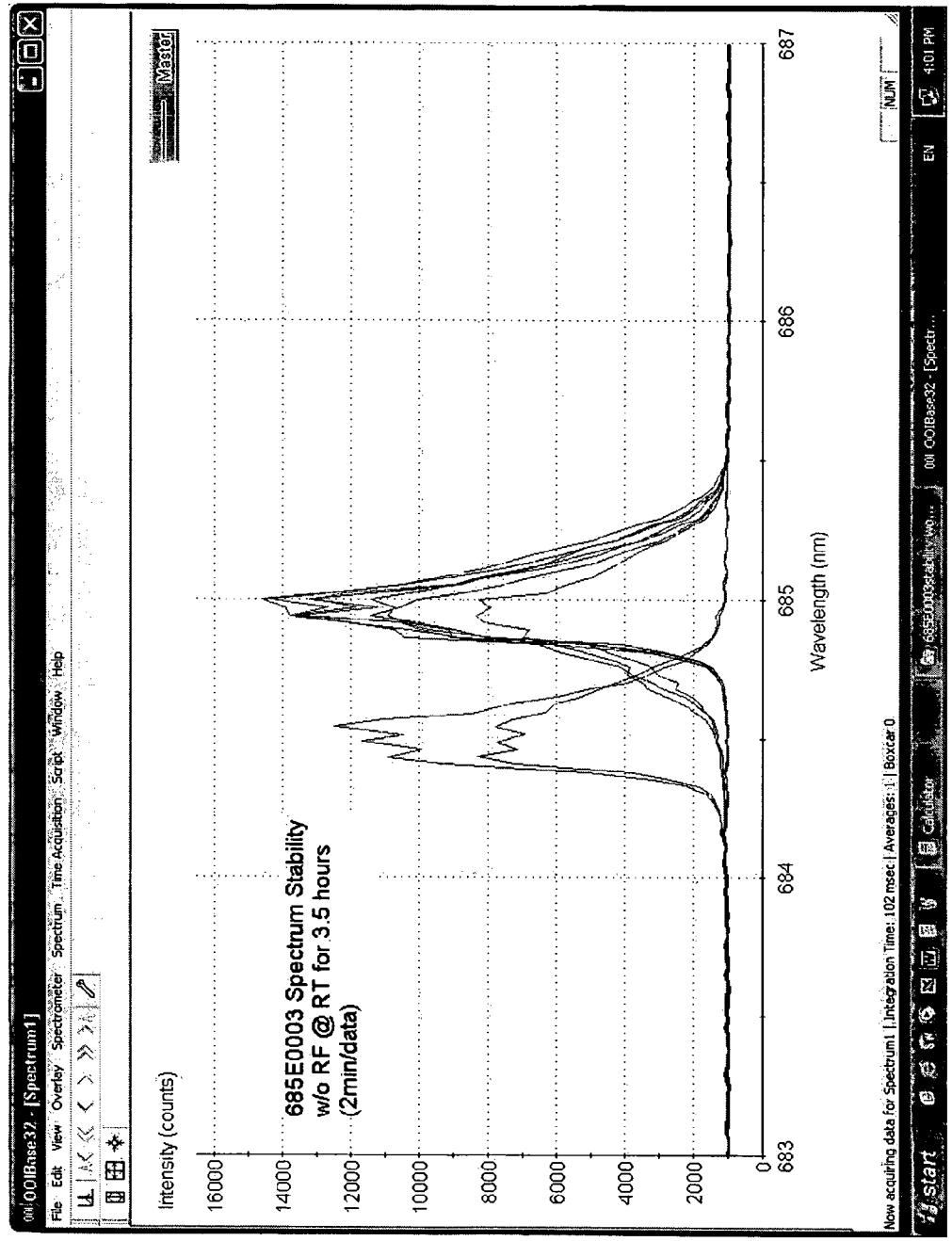
FIG. 9A is the test results showing shot-to-shot fluctuation of the laser spectra without the present invention.
Figure 9B:
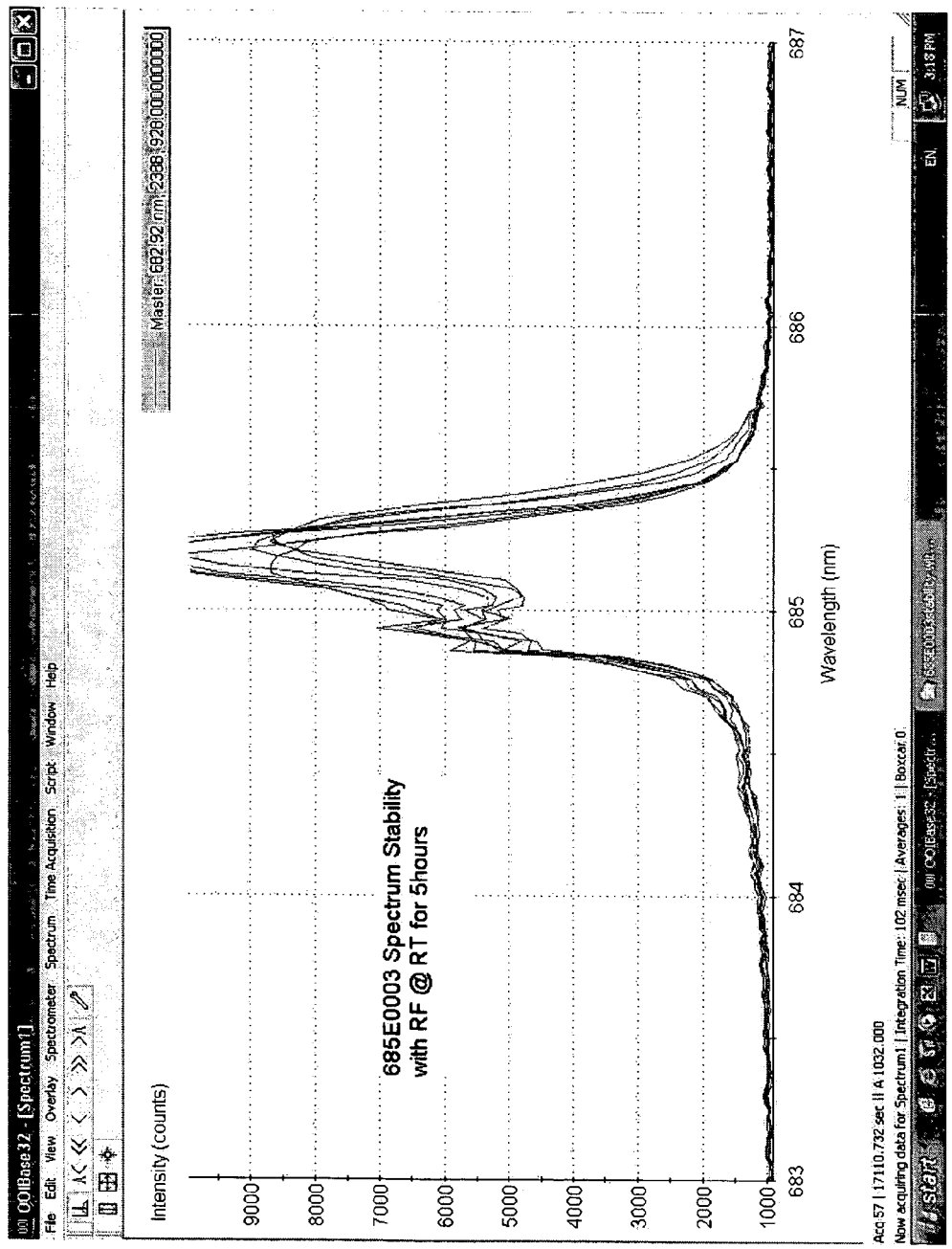
FIG. 9B is the test results showing stabilized spectrum of a laser equipped with the present invention.

Due to mode hop and/or mode partition, spectrum of laser diode typically fluctuates. For illustration, test results from a laser diode coupled with a multimode fiber are shown in FIG. 9A. Optical noise due to mode hop is observed at high level when the laser is not stabilized by the present invention. With our invention, the laser spectrum is broadened and stabilized, as shown in FIG. 9B.

Figure 10A:
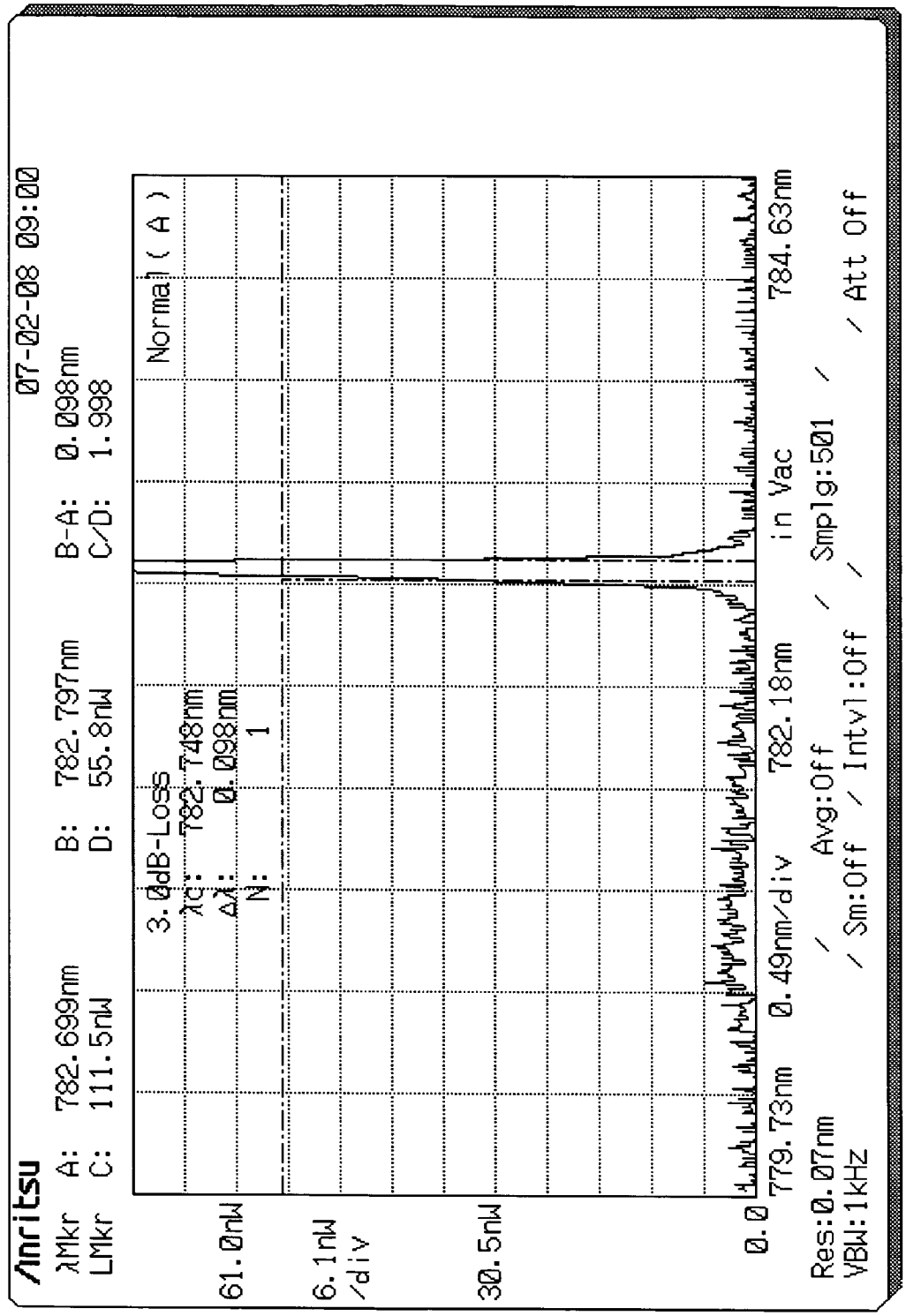
FIG. 10A is the test result showing laser spectrum stabilized by RF modulation of small degree.
Figure 10B:
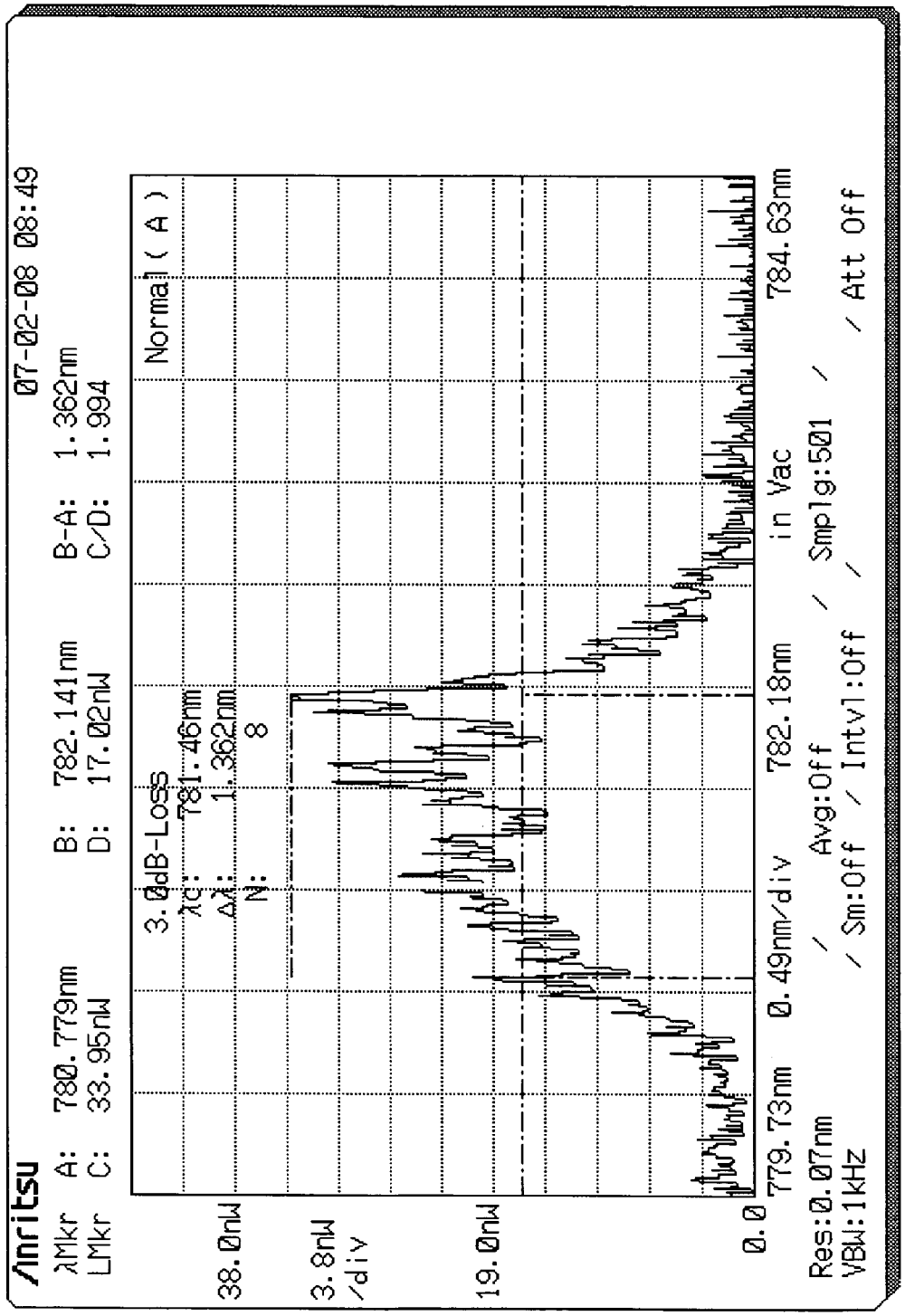
FIG. 10B is the test result showing laser spectrum broadened by deep RF modulation.

By varying the degree of modulation, the laser spectrum changes accordingly. Provided that the modulation degree is sufficiently small, a narrowband laser output is observed, as shown in FIG. 10A. Increasing the degree of modulation to periodically turn the laser on and off, we obtain a broadened laser spectrum. For illustration, an example is given in FIG. 10B. Different laser output power requires different degree of modulation to broaden the laser spectrum.

Unwanted light reflection from optical elements external to the laser cavity, the so-called optical feedback, may disturb laser operation, causing instability. As has been indicated in the foregoing text, optical feedback may depopulate certain lasing levels and change the gain threshold, causing intensity fluctuations and/or wavelength shifts. Furthermore, the interference of the feedback light with the resonant cavity primary light may create side bands of the laser emission spectrum. Optical feedback is particularly detrimental to operation of DPSS lasers because of additional optics and transfer of fluctuations in intensity and/or wavelength from the pumping sources to the pumped solid-state lasers. For gain media with narrow absorption bands, the wavelength shift may lead to significant reduction of the excitation energy. Spatially non-uniform excitation may be resulted from the interference between the primary pumping light and the feedback light. Fortunately, these problems can be remedied by implementation of the present invention. With a drive current repeatedly drops below the threshold, the laser is forced to operate in multiple modes with a stable envelope of FWHM≈1 nm. Consequently, the coherence between the feedback light and the cavity primary light collapses and the integrity of the laser spectrum remains.

Another advantage of the RF modulation is great reduction of the coherence length of index-guided diode lasers, which, in conjunction with selective optical feedback from, e.g., fiber Bragg gratings (FBG), enables low-noise wavelength stabilization. What is more, when a FBG is placed beyond coherence length, the phase memory of optical feedback is lost. Consequently, the linewidth of each laser mode increases from ~10 MHz to several GHz. This further reduces phase related optical noise. Gain-guided lasers operate in multi-mode all the time. There is no mode hop.

As can be understood by those skilled in the art, our inventive teachings are not limited to DPSS lasers. Other applications whereof the RF modulation stabilized laser diodes are appropriate as primary light sources include frequency conversion, seeding, excitation of fiber media, erbium doped optical amplifier (EDFA), Raman amplifiers, and master oscillator power amplifier (MOPA), to mention a few.

An important application of the present invention relates to SLM injection seeding. SLM seed sources normally are based on short cavities to increase inter-mode spacing and/or using intra-cavity or extra-cavity etalons or gratings or external cavities to filter out a desired single mode seed beam and require careful control of the cavity length. They are complicated and are limited to a small number of wavelengths. Single longitudinal mode laser output can also be obtained by a multimode seeder, which eliminates the need for cavity length control. However, the conventional multimode seeding may not be stable and the slave laser may suffer from mode hopping.

Fortunately, injection seeding can be accomplished much more effectively by integrating our inventive modulator into a seed laser, which is equipped with a set of optics elements including beam-shaping lenses and one or more optical isolator(s) to protect the seeder from damage or interference, which may cause instability. According to our inventive teachings, the optical isolator can be a combination of a Faraday rotator and a polarizer, or other elements characteristic of polarization discrimination such as birefringent crystals for separation of the e-ray and o-ray through the walk-off effect, or polarization beam-splitter prisms.

In one preferred embodiment, an RF modulator constructed in accordance with our inventive teachings is integrated into a seed laser operated in a nanosecond pulse mode. By injecting the seed signal into a pulsed solid-state laser, such as Ti:Sipphire laser, laser output of good beam quality and large beam size can be obtained in an ordinary short Fabry-Perot cavity. The short cavity shortens the pulse tail and produces extremely narrow pulses. Challenges for short cavity and short pump pulse operations include TEM00 mode control, wavelength and spectral bandwidth control, and timing jitter or pulse repetition frequency variation caused by random fluctuation in the effective cavity length, which typically require complex and costly systems such as those employed for phase locking in order to synchronize pulse timing between the seeder and seeded laser. Advantageously, the seed laser constructed according to the present invention is capable of reducing laser build-up time, controlling TEM00 output, lasing wavelength, and laser temporal pulse shape, while eliminates the need for cavity length stabilization and phase locking schemes.

With reference to FIG. 11, there is shown in schematic form an exemplary apparatus 1100 wherein a solid-state laser 1110, e.g., a Ti:Sipphire laser with a short Fabry-Perot cavity, is injected by photons, radiated from a seed laser 1150, which is controlled by a driving circuit 1160 constructed in accordance with the present invention, through a beam shaping optics 1130 and an isolator 1120. A timing synchronizer 1140 is optionally employed for synchronization of pulse timing between the seed laser 1150 and the short cavity slave laser 1110. Preferably, the seed laser 1150 produces a series of pulses in absence of mutual coherence and the interval between two successive pulses is longer than the decay time of a radiation in the resonator of slave laser 1110. The latter is proportional to the cavity optical length. In this way, laser output of nanosecond pulse width with stable TEM00 mode can be obtained in a short cavity. This configuration is of particular merit for seeding Ti:Sapphire laser, which has a broad gain bandwidth and is capable of producing short pulses. As can be appreciated by those skilled in the art, the slave oscillator is not limited to Ti:sapphire, many other lasers, in particular vibronic lasers, can be effectively seeded by a laser diode with stable intensity and spectrum, as taught by the present invention.

Figure 12A:
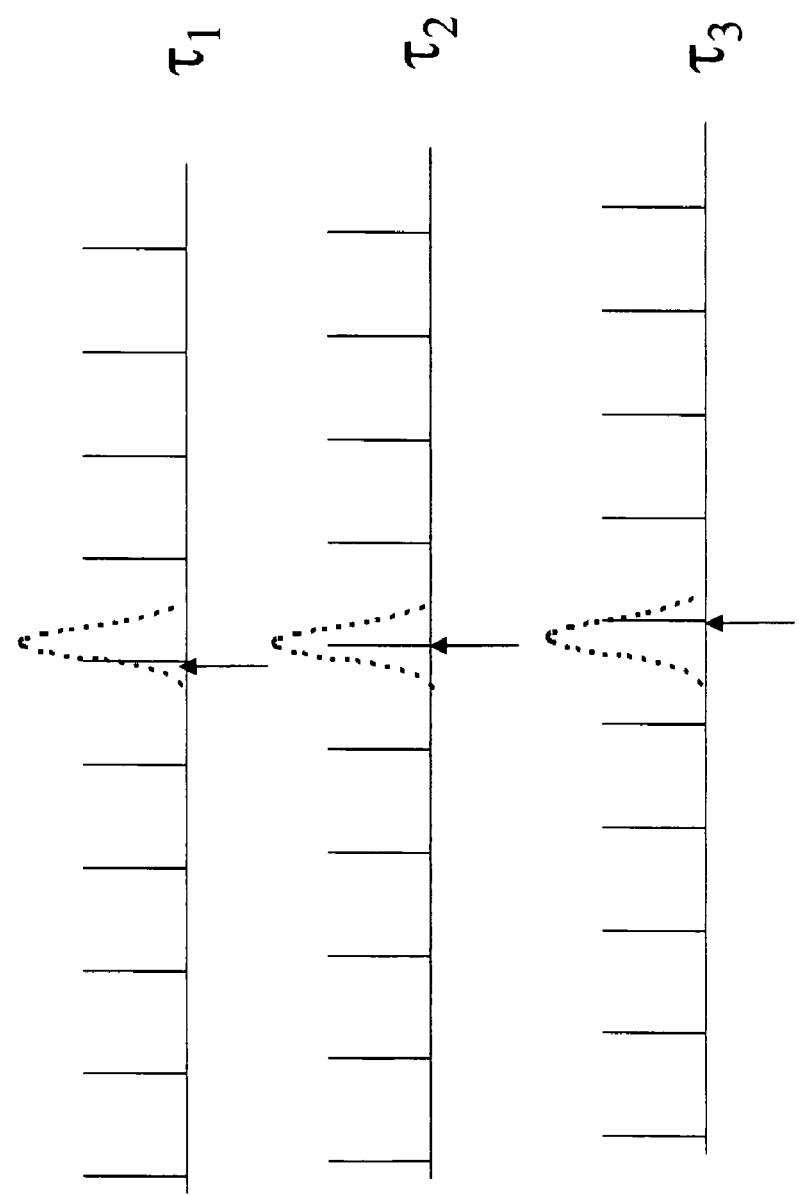
FIG. 12A is a conceptual illustration of the SLM injection seeding mechanism.

For a seed laser modulated with small degree, the lasing wavelength continuously sweeps over a narrow range, forming an umbrella such that by a fine tuning of the DC bias one and only one longitudinal mode of the slave is well covered. In this way, the master-slave resonance can be achieved in a single mode without slave cavity stabilization and phase locking. A better understanding can be reached by viewing FIG. 12A, wherein the SLM injection seeding mechanism is conceptually illustrated. By applying a dithering drive current, as shown in FIG. 5B, the seeder emits laser light with a narrow-band spectrum (dotted envelope), which covers one particular longitudinal mode of the slave oscillator at any time instant. Without cavity length stabilization, the longitudinal modes of the slave oscillator (vertical bars) randomly shift with time. Nevertheless, the spectral umbrella of the seeder supports the oscillation of the selected longitudinal mode (pointed by the arrow) all the time. Stable SLM injection seeding thus can be achieved efficiently and cost-effectively.

Figure 12B:
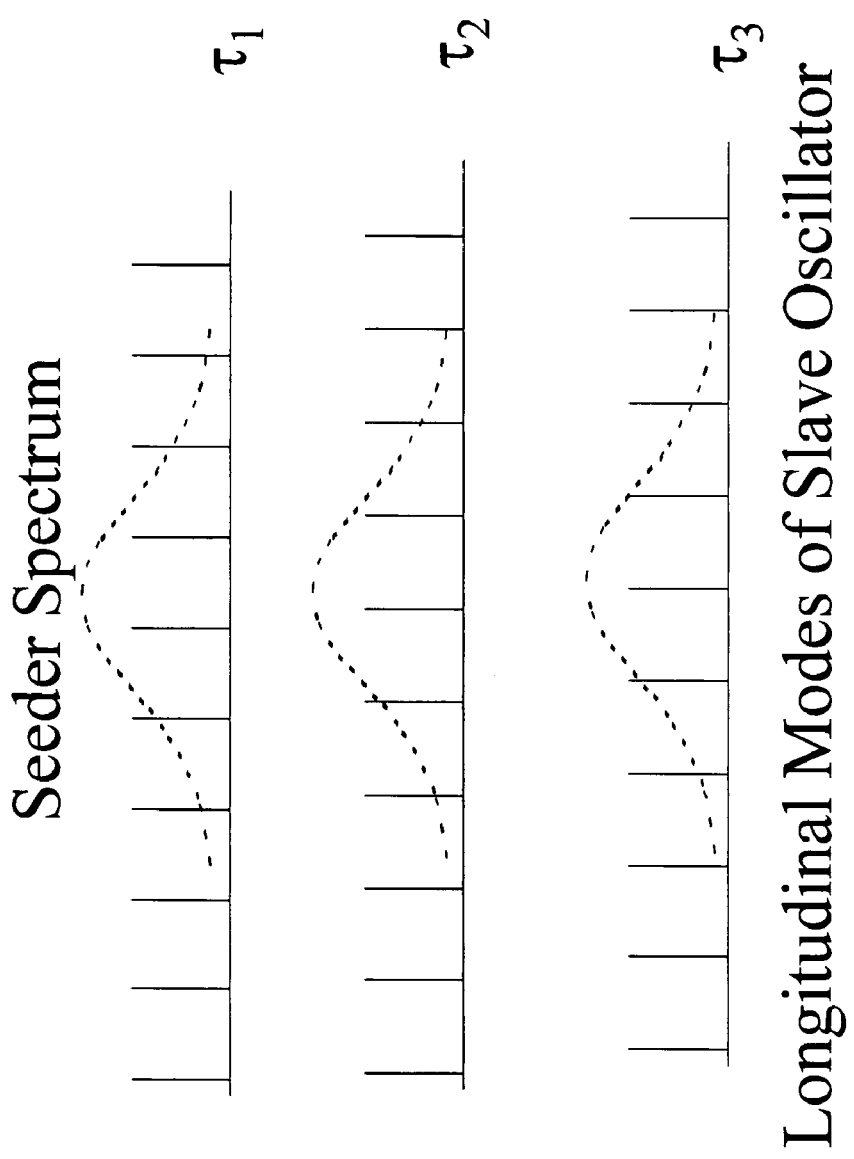
FIG. 12B is a conceptual illustration of the multimode injection seeding mechanism.

On the other hand, with a modulation deep enough to periodically turn on/off the seeder and eliminate the memory, it is possible to produce stable multimode laser output with a broad spectrum of 1 nm or wider. In conjunction with a slave laser, said seeder enables a broadband laser output with high brightness and low coherence, which is particularly important for applications such as laser display systems, in which speckle reduction is critical. FIG. 12B conceptually shows the mechanism of multimode injection seeding. At any instant in time, the broadband seeder spectrum (dotted envelope) may cover different longitudinal modes of the slave oscillator (vertical bars). In spite of such random variations, on time average, the intensity and spectrum of the slave laser output are both stable.

Speckle noise is an interference pattern resulted from random modulation of the phase of a coherent light and can be reduced by superimposing a number of uncorrelated speckle patterns. Uncorrelated patterns can be obtained by diversity of time, space, frequency, or polarization. Previous methods for speckle reduction such as oscillatory motion, active diffuser, diffractive optical elements with or without rotation, and multiple Raman cells are complex and cause significant power losses. The present invention based on RF modulation provides an efficient and cost-effective means for speckle reduction. In view of its applicability to a broad range of wavelength, the RF modulation scheme disclosed in this patent is particularly promising for color display systems where lasers of red, green, and blue are frequently used.

What is claimed is:

1. A low-noise laser diode module comprising:
    a laser diode for emitting light with a wavelength in the range from ultra-violet to infrared;
    a driving circuit connected to said laser for providing drive current with RF modulation; and
    an automatic power control subsystem for adjusting drive current to maintain output power of said laser at a predetermined level;
    wherein:
    said driving circuit further comprising:
        a DC generator for generating DC bias tunable over a desired range and adjustable by the automatic power control subsystem;
        a local oscillator for generating RF signal of variable amplitude;
        a summing junction for superimposing said RF signal with said DC bias;
        a power supply control circuit for logically controlling order of supplying electrical power to said DC generator and to said local oscillator so that said laser diode will never be intolerably back biased; and
    a clamping diode for shunting reverse drive current or overpowered forward drive current for further protecting said laser diode from damage.

2. A low-noise laser diode module according to claim 1, wherein
    said RF signal is sine wave or distorted sine wave.

3. A low-noise laser diode module according to claim 1, wherein
    said RF signal is rectified sine wave;
    said rectified sine wave is obtained by rectification;
    said rectification is obtained by high frequency diodes.

4. A low-noise laser diode module according to claim 1, wherein
    said RF signal is a non-sine wave;
    said non-sine wave is obtained by the use of a switching element, a feedback loop, and a delaying circuit.

5. A low-noise laser diode module according to claim 1, wherein
    said automatic power control subsystem further comprising:
    a photon-to-electron conversion device for detecting laser output power and providing a feedback signal to said drive circuit in response to drifts in laser output power;
    said photon-to-electron conversion device is external to laser assembly and accepts only light from the front facet of the laser diode;
    said photon-to-electron conversion device only responds to low-frequency signals but not to high-frequency signals;
    a beam splitter for dividing laser output into two portions and delivering a fraction of laser light into said photon-to-electron conversion device;
    a feedback amplifier for amplifying feedback signal;
    a reference current or voltage preset according to the desired optical output power and optimized DC bias; and
    a comparator for comparing the feedback signal with the reference and adjusting said DC bias according to the comparison result.

6. A low-noise laser diode module according to claim 5, wherein said automatic power control subsystem further comprising
    a thermoelectric controller affixed to the laser diode for active temperature control, the operation temperature of the laser diode is selected in mode-hop insensitive regions.

7. A low-noise laser diode module according to claim 1, wherein
    said automatic power control subsystem further comprising:
    a thermoelectric controller for maintaining the laser diode at a predefined temperature; and
    a constant current source for providing stable drive current;
    said constant current source is stabilized by a current feedback loop; wherein:
    said current feedback loop further comprising:
    a current sensing resistor;
    a reference preset according to the desired optical output power and optimized DC bias; and
    a comparator for comparing the feedback signal with the reference and adjusting said DC bias according to the comparison result.

8. A low-noise laser diode module according to claim 1, wherein the drive current periodically changes with a frequency sufficiently high to avoid domination of any particular longitudinal mode oscillation in the laser diode and over a range such that the maximum current is tolerable to the laser diode and the minimum current is below the threshold of the laser diode and is sufficiently low to eliminate all the memory and ASE.

9. A low-noise laser diode module comprising:

a laser diode for emitting light with a wavelength in the range from ultra-violet to infrared;

a driving circuit connected to said laser for providing drive current with RF modulation; and an automatic power control subsystem for adjusting drive current to maintain output power of said laser at a predetermined level; wherein:

said driving circuit further comprising:
- a DC generator for generating DC bias at the operating current level and adjustable by the automatic power control subsystem;
- a pulse forming network for generating narrow pulses with negative polarity;
- a summing junction for superimposing the negative pulses with said DC bias;
- a power supply control circuit for logically controlling order of supplying electrical power to said DC generator and to said pulse forming network so that said laser diode will never be intolerably back biased; and
- a clamping diode for shunting reverse drive current or overpowered forward drive current for further protecting said laser diode from damage;

wherein:

said pulse forming network further comprising:
- a blocking oscillator or other pulse oscillator for generating narrow pulses with steep rise and fall at RF rate; and
- a transformer or other coupling element for coupling, in series, said narrow pulses with the laser diode and reversing the pulse polarity.

10. A low-noise laser diode module comprising:

a laser diode for emitting light with a wavelength in the range from ultra-violet to infrared;

a driving circuit connected to said laser for providing drive current with RF modulation; and an automatic power control subsystem for adjusting drive current to maintain output power of said laser at a predetermined level; wherein said driving circuit further comprising:
- a DC generator for generating DC bias tunable over a desired range and adjustable by the automatic power control subsystem;
- an active electronic component with an impedance variable in response to input signal;
- an RF signal source, preferably having steep rise and fall, for trigging said active electronic component to momentarily shunt said laser drive current; and
- a clamping diode for shunting reverse drive current or overpowered forward drive current for protecting said laser diode from damage;

wherein said active electronic component is closely coupled to the laser diode in parallel and is preferably transistor arrays capable of operating in rapid pulsed mode;

the shunt ratio is variable, depending on the specific application.

* * * * *